(12) United States Patent
Yotsumoto et al.

(10) Patent No.: US 12,317,490 B2
(45) Date of Patent: May 27, 2025

(54) SEMICONDUCTOR MEMORY DEVICE

(71) Applicant: Kioxia Corporation, Tokyo (JP)

(72) Inventors: Akira Yotsumoto, Yokkaichi (JP);
Keisuke Suda, Yokkaichi (JP); Kenji Tashiro, Kuwana (JP); Tetsuya Yamashita, Yokkaichi (JP); Daigo Ichinose, Nagoya (JP)

(73) Assignee: Kioxia Corporation, Tokyo (JP)

( * ) Notice: Subject to any disclaimer, the term of this patent is extended or adjusted under 35 U.S.C. 154(b) by 596 days.

(21) Appl. No.: 17/693,617

(22) Filed: Mar. 14, 2022

(65) Prior Publication Data

US 2023/0086773 A1 Mar. 23, 2023

(30) Foreign Application Priority Data

Sep. 17, 2021 (JP) ................................. 2021-152448

(51) Int. Cl.
*H10B 43/10* (2023.01)
*H10B 41/41* (2023.01)
*H10B 43/27* (2023.01)

(52) U.S. Cl.
CPC .............. *H10B 43/10* (2023.02); *H10B 41/41* (2023.02); *H10B 43/27* (2023.02)

(58) Field of Classification Search
CPC ......... H10B 43/10; H10B 41/41; H10B 43/27
See application file for complete search history.

(56) References Cited

U.S. PATENT DOCUMENTS

| | | |
|---|---|---|
| 2020/0295033 A1 | 9/2020 | Sakamoto et al. |
| 2021/0043640 A1 | 2/2021 | Kawaguchi et al. |
| 2022/0005822 A1* | 1/2022 | Manthena .............. H10B 41/10 |

FOREIGN PATENT DOCUMENTS

JP 2021-027290 A 2/2021

* cited by examiner

*Primary Examiner* — Karen Kusumakar
(74) *Attorney, Agent, or Firm* — Oblon, McClelland, Maier & Neustadt, L.L.P.

(57) ABSTRACT

According to one embodiment, a semiconductor memory device includes: a stacked body having a stacked structure in which a plurality of conductive layers and a plurality of insulating layers are alternately stacked one by one, the stacked body including a memory region and a dummy region arranged in a first direction intersecting a stacking direction of the plurality of conductive layers, the dummy region including a first stepped portion in which at least a part of the plurality of conductive layers on an upper layer side is processed in a stepped shape and terminates at an end portion opposite to the memory region in the first direction; and first and second plate-like portions extending in the stacking direction and the first direction in the stacked body at positions in the memory region away from each other in a second direction intersecting the stacking direction and the first direction, the first and second plate-like portions being directly or indirectly connected to each other and terminating in the dummy region, each of the first and second plate-like portions dividing the stacked body excluding at least a part of the end portion of the dummy region in the second direction.

20 Claims, 18 Drawing Sheets

SEMICONDUCTOR MEMORY DEVICE

CROSS-REFERENCE TO RELATED APPLICATIONS

This application is based upon and claims the benefit of priority from Japanese Patent Application No. 2021-152448, filed on Sep. 17, 2021; the entire contents of which are incorporated herein by reference.

FIELD

Embodiments described herein relate generally to a semiconductor memory device.

BACKGROUND

In a semiconductor memory device such as a three-dimensional nonvolatile memory, a configuration in which a memory region or the like where a plurality of memory cells is arranged is divided into a plurality of block regions which is an unit of data erasing may be adopted. In this case, for example, there is a method of forming slits that divide the memory region to electrically isolate the plurality of block regions. At this time, it is desirable to suppress an increase in the slit width such that other configurations in the vicinity of the slits do not come into contact with the slits.

DETAILED DESCRIPTION

According to one embodiment, a semiconductor memory device includes: a stacked body having a stacked structure in which a plurality of conductive layers and a plurality of insulating layers are alternately stacked one by one, the stacked body including a memory region and a dummy region arranged in a first direction intersecting a stacking direction of the plurality of conductive layers, the dummy region including a first stepped portion in which at least a part of the plurality of conductive layers on an upper layer side is processed in a stepped shape and terminates at an end portion opposite to the memory region in the first direction; a plurality of first pillars extending in the stacked body in the stacking direction in the memory region and each forming memory cells at respective intersections with at least a part of the plurality of conductive layers; and first and second plate-like portions extending in the stacking direction and the first direction in the stacked body at positions in the memory region away from each other in a second direction intersecting the stacking direction and the first direction, the first and second plate-like portions being directly or indirectly connected to each other and terminating in the dummy region, each of the first and second plate-like portions dividing the stacked body excluding at least a part of the end portion of the dummy region in the second direction.

Hereinafter, non-limiting exemplary embodiments of the present invention will be described in detail with reference to the drawings. Note that the present invention is not limited by the following embodiments. In addition, constituent elements in the following embodiments include those that can be easily conceivable by those skilled in the art or those that are substantially the same.

First Embodiment

Hereinafter, a first embodiment will be described in detail with reference to the drawings.
(Configuration Example of Semiconductor Memory Device)

Figure 1A:
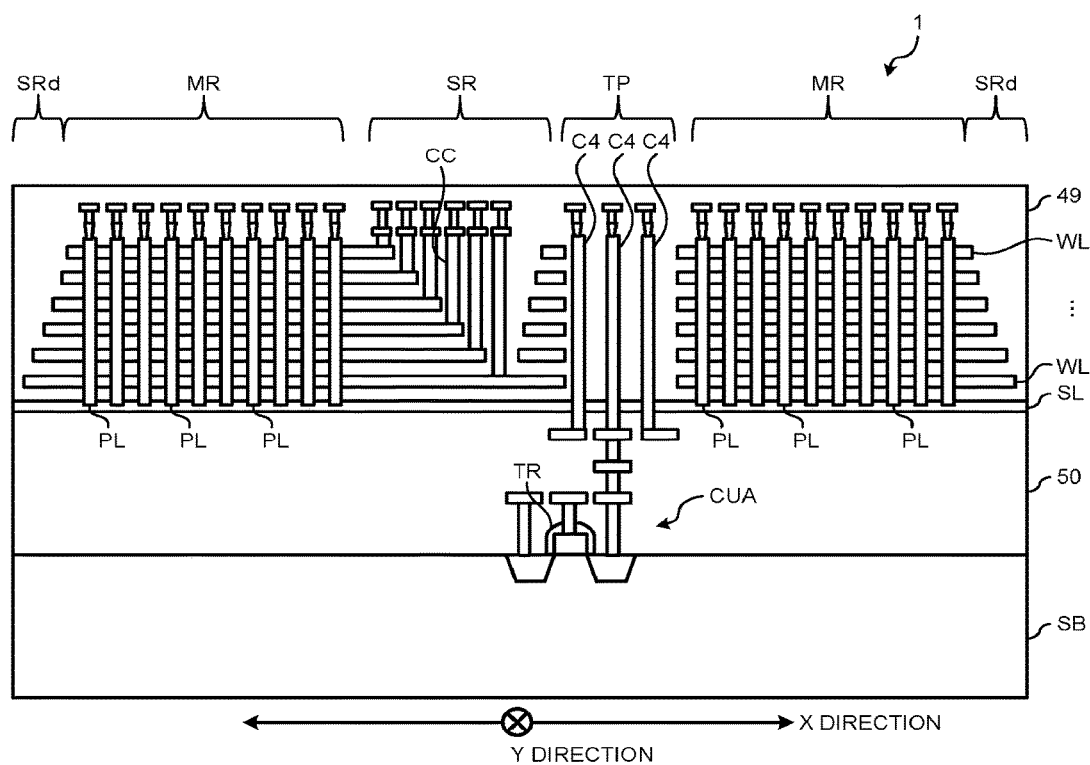
FIGS. 1A and 1B are diagrams illustrating a schematic configuration example of a semiconductor memory device according to a first embodiment.
Figure 1B:
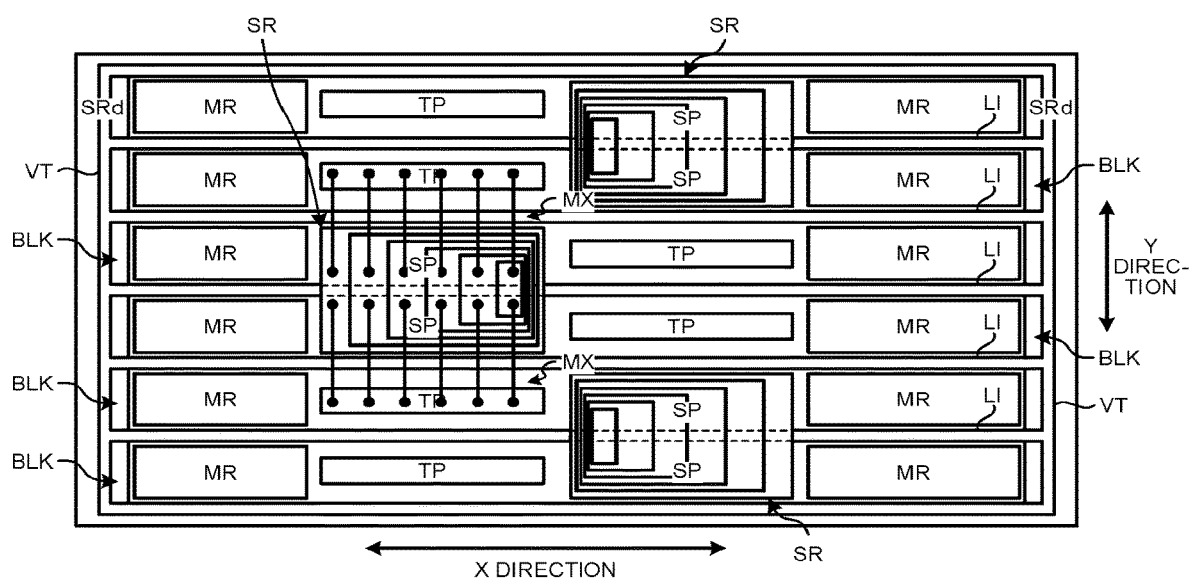

FIGS. 1A and 1B are diagrams illustrating a schematic configuration example of a semiconductor memory device 1 according to the first embodiment. FIG. 1A is a cross-sectional view of the semiconductor memory device 1 along the X direction, and FIG. 1B is a schematic plan view illustrating a layout of the semiconductor memory device 1. However, in FIG. 1A, hatching is omitted in consideration of visibility of the drawings. In addition, in FIG. 1A, part of upper layer wiring is omitted.

Note that, in the present specification, both the X direction and the Y direction are directions along a direction of surfaces of word lines WL to be described later, and the X direction and the Y direction are orthogonal to each other. In addition, an electrical lead-out direction of word lines WL to be described later may be referred to as a first direction, and the first direction is a direction along the X direction. In addition, a direction intersecting the first direction may be referred to as a second direction, and the second direction is a direction along the Y direction. However, since the semiconductor memory device 1 may include variations in manufacturing, the first direction and the second direction are not necessarily orthogonal to each other.

As illustrated in FIGS. 1A and 1B, the semiconductor memory device 1 includes a peripheral circuit CUA, memory regions MR, through contact regions TP, stepped regions SR, and dummy regions SRd on a substrate SB.

The substrate SB is, for example, a semiconductor substrate such as a silicon substrate. The peripheral circuit CUA including a transistor TR, wiring, and the like is arranged on the substrate SB. The peripheral circuit CUA contributes to operations of memory cells described later.

The peripheral circuit CUA is covered with an insulating layer 50. A source line SL is arranged on the insulating layer 50. A plurality of word lines WL is stacked above the source line SL. The plurality of word lines WL is covered with an insulating layer 49. The insulating layer 49 also extends around the plurality of word lines WL. The plurality of word lines WL includes the dummy regions SRd on both sides in the X direction.

A plurality of plate-like contacts LI penetrating the word lines WL in the stacking direction and extending in the direction along the X direction is arranged in the plurality of word lines WL. The plurality of plate-like contacts LI is indirectly connected to each other by a plate-like portion VT and terminated in the dummy regions SRd on both sides in the X direction of the plurality of word lines WL. The plate-like portion VT penetrates the word lines WL in the stacking direction and extends in the dummy regions SRd in the direction along the Y direction. As a result, the plurality of word lines WL is divided in the Y direction by the plurality of plate-like contacts LI except for both end portions in the X direction.

Between the plurality of plate-like contacts LI, a plurality of memory regions MR, stepped regions SR, and through contact regions TP are arranged side by side in the X direction. A plurality of memory regions MR is arranged side by side in the X direction with respect to a stepped region SR and a through contact region TP with the stepped region SR and the through contact region TP interposed therebetween. A region between plate-like contacts LI adjacent in the Y direction is called a block region BLK.

In such a memory region MR, a plurality of pillars PL penetrating the word lines WL in the stacking direction is arranged. A plurality of memory cells is formed at each intersections of the pillars PL and the word lines WL. As a result, the semiconductor memory device 1 is configured as, for example, a three-dimensional nonvolatile memory in which memory cells are three-dimensionally arranged in the memory regions MR.

The stepped region SR includes a plurality of stepped portions SP in which a plurality of word lines WL is dug down in a mortar shape in the stacking direction. In one stepped region SR, two stepped portions SP arranged in the Y direction with one plate-like contact LI interposed therebetween are arranged.

A stepped portion SP forms one side of a mortar shape descending in a stepped shape from both sides in the X direction and one side in the Y direction toward the bottom surface. Meanwhile, the other side of the stepped portion SP in the Y direction is opened toward the side surface of the plate-like contact LI.

Each step of the stepped portion SP is configured by the word line WL of each layer. The word line WL of each layer maintains electrical conduction on both sides in the X direction across the stepped region SR via the stepped portion on one side in the Y direction of the stepped portion SP. A contact CC connecting the word line WL of each layer and the upper layer wiring MX is arranged in the terrace portion of each step of the stepped portion SP.

As a result, the word lines WL stacked in a plurality of layers can be individually led out. That is, a write voltage, a read voltage, and the like are applied from these contacts CC to the memory cells in the memory regions MR on both sides in the X direction via the word lines WL at the same height positions as the memory cells.

Note that, in the present specification, the direction in which the terrace surface of each step of the stepped portion SP faces is defined as the upward direction.

The through contact region TP not including the word lines WL is arranged on one side in the X direction of the stepped region SR. In the through contact region TP, through contacts C4 that connect the peripheral circuit CUA arranged on the lower substrate SB and the upper layer wiring MX connected to the contacts CC of the stepped portion SP are arranged. Various voltages applied from the contacts CC to the memory cells are controlled by the peripheral circuit CUA via the through contacts C4, the upper layer wiring MX, and the like.

Next, a detailed configuration example of the semiconductor memory device 1 will be described with reference to FIGS. 2A to 3.

Figure 2A:
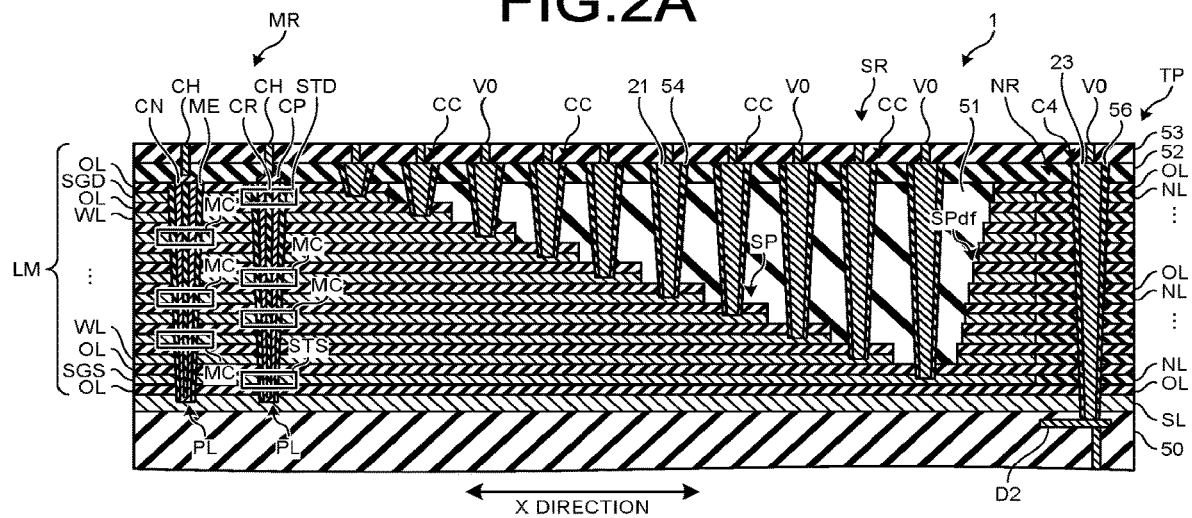
FIGS. 2A to 2C are cross-sectional views of the semiconductor memory device according to the first embodiment.
Figure 2B:
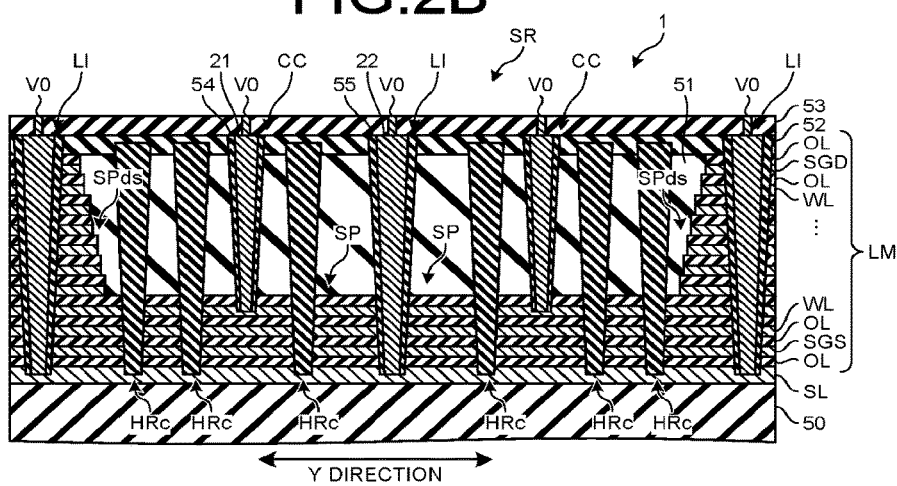
Figure 2C:
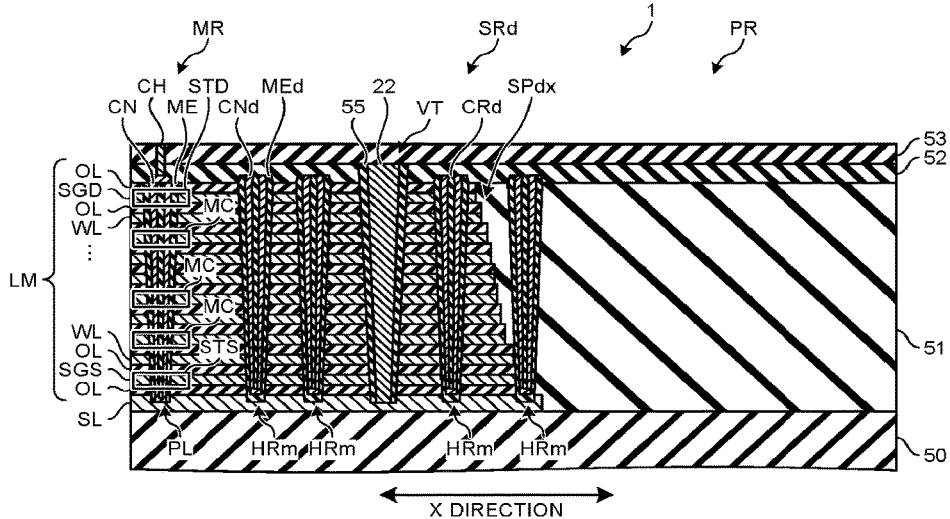

FIGS. 2A to 2C are cross-sectional views of the semiconductor memory device 1 according to the first embodiment. FIG. 2A is a cross-sectional view along the X direction including the memory region MR, the stepped region SR, and the through contact region TP. FIG. 2B is a cross-sectional view along the Y direction including the stepped region SR. FIG. 2C is a cross-sectional view along the X direction including the memory region MR and the dummy region SRd. However, in FIGS. 2A to 2C, structures below the insulating layer 50 such as the substrate SB and the peripheral circuit CUA are omitted.

As illustrated in FIGS. 2A to 2C, a stacked body LM is arranged above the source line SL. In the stacked body LM, a plurality of word lines WL and a plurality of insulating layers OL are alternately stacked one by one. In addition, the stacked body LM includes one or a plurality of select gate lines SGD and SGS arranged above the uppermost word line WL and below the lowermost word line WL, respectively.

The source line SL is, for example, a conductive polysilicon layer. The word lines WL and the select gate lines SGD and SGS as the plurality of conductive layers are, for example, tungsten layers or molybdenum layers. The number of stacked word lines WL and select gate lines SGD and SGS in the stacked body LM is arbitrary. The insulating layers OL are, for example, silicon oxide layers or the like.

The stacked body LM includes the memory region MR, the through contact region TP, the stepped region SR, and the dummy regions SRd arranged in the X direction. The memory region MR, the through contact region TP, and the stepped region SR are arranged side by side in the X direction in the central portion of the stacked body LM in the X direction. The dummy regions SRd are arranged on both sides in the X direction of the memory region MR, the through contact region TP, and the stepped region SR and at positions including both end portions in the X direction of the stacked body LM. The upper surface of the stacked body LM is covered with an insulating layer 52. An insulating layer 53 is arranged on the insulating layer 52. Note that each of the insulating layers 52 and 53 constitutes a part of the insulating layer 49 in FIG. 1(*a*).

As illustrated in FIG. 2B, the stacked body LM is divided in the Y direction by the plurality of plate-like contacts LI. However, as described above, the plurality of plate-like contacts LI does not extend beyond the both end portions in the X direction of the stacked body LM, and divides the region of the stacked body LM excluding the both end portions in the X direction.

The plate-like contacts LI are arranged in the Y direction and each extend in the stacking direction of the stacked body LM and the direction along the X direction. That is, the plate-like contact LI penetrates the insulating layer 52 and the stacked body LM and reaches the source line SL. In addition, the plate-like contacts LI continuously extends in the stacked body LM excluding both end portions in the X direction from predetermined positions in the X direction in the dummy regions SRd on both sides in the X direction of the stacked body LM to the central portion in the X direction of the stacked body LM.

In addition, each of the plate-like contacts LI includes an insulating layer 55 and a conductive layer 22. The insulating layer 55 is, for example, a silicon oxide layer or the like. The conductive layer 22 is, for example, a tungsten layer or a conductive polysilicon layer.

The insulating layer 55 covers the side walls facing each other in the Y direction of the plate-like contacts LI. The conductive layer 22 is filled inside the insulating layer 55 and connected to the source line SL. In addition, the conductive layer 22 is connected to the upper layer wiring MX (see FIG. 1B) arranged in the further upper layer via a plug V0 arranged in the insulating layer 53. With such a configuration, the plate-like contacts LI function as source line contacts.

In addition, as described above, the memory region MR, the stepped region SR, and the through contact region TP are arranged between plate-like contacts LI as first and second plate-like portions adjacent to each other in the Y direction.

As illustrated in FIGS. 2A and 2C, the plurality of pillars PL is arranged in the memory region MR.

The pillars PL as a plurality of first pillars are dispersedly arranged in the memory region MR. Each pillar PL has, for example, a circular shape, an elliptical shape, an oval shape, or the like as a cross-sectional shape in a direction along the layer direction of the stacked body LM, that is, in a direction along the XY plane.

Each of the plurality of pillars PL includes a memory layer ME extending in the stacked body LM in the stacking direction of the stacked body LM, and a channel layer CN penetrating the stacked body LM and connected to the source line SL. As described later, the memory layer ME has a multilayer structure in which a block insulating layer, a charge trap layer, and a tunnel insulating layer are stacked in this order from the outer peripheral side of the pillar PL. The channel layer CN is arranged inside the memory layer ME and on the bottom surface of the pillar PL. A core layer CR is filled further inside the channel layer CN.

In addition, each of the plurality of pillars PL includes a cap layer CP at the upper end portion. The cap layer CP is arranged in the insulating layer 52 so as to cover at least the upper end portion of the channel layer CN, and is connected to the channel layer CN. The cap layer CP is connected to upper layer wiring such as a bit line arranged in a further upper layer via a plug CH arranged in the insulating layers 52 and 53.

The block insulating layer and the tunnel insulating layer of the memory layer ME, and the core layer CR are, for example, silicon oxide layers or the like. The charge trap layer of the memory layer ME is, for example, a silicon nitride layer or the like. The channel layer CN and the cap layer CP are semiconductor layers such as polysilicon layers or amorphous silicon layers.

With the above configuration, the memory cells MC are formed in portions facing the individual word lines WL on the side surfaces of the pillars PL. When a predetermined voltage is applied from the word lines WL, data is written to and read from the memory cells MC. Note that the block region BLK described above is, for example, a unit for erasing data written in the memory cells MC. That is, the data held by the plurality of memory cells MC belonging to one block region BLK is collectively erased.

In addition, select gates STD and STS are formed on the side surfaces of the pillars PL facing the select gate lines SGD and SGS arranged in the upper layer or the lower layer of the word lines WL, respectively. When predetermined voltages are applied from the select gate lines SGD and SGS, the select gates STD and STS are turned on or off, and the memory cells MC of the pillars PL to which the select gates STD and STS belong can be brought into a selected state or a non-selected state.

As illustrated in FIGS. 2A and 2B, stepped portions SP, SPdf, and SPds are arranged in the stepped region SR. Each of the stepped portions SP, SPdf, and SPds has a shape in which the plurality of word lines WL, the select gate lines SGD and SGS, and the plurality of insulating layers OL are processed in a stepped shape.

Among the stepped portions SP, SPdf, and SPds, the stepped portion SP has a function of electrically leading out the plurality of word lines WL and the select gate lines SGD and SGS to the upper layer wiring MX. The other stepped portions SPdf and SPds are dummy stepped portions that do not contribute to the function of the semiconductor memory device 1.

The stepped portion SP extends in the X direction at a position close to the memory region MR and descends in a direction away from the memory region MR. The stepped portion SPdf extends in the X direction so as to face the stepped portion SP at a position close to the through contact region TP and descends toward the stepped portion SP.

The stepped portion SPds is arranged in the vicinity of the plate-like contact LI on one side in the Y direction of the stepped portions SP and SPdf at a position between the stepped portions SP and SPdf. The stepped portion SPds extends in the Y direction so as to face the plate-like contact LI on the other side adjacent in the Y direction, and descends toward the plate-like contact LI on the other side.

Here, in the stepped portions SPdf and SPds, the terrace portion of each step is shorter than the terrace portion of the stepped portion SP. Thus, the stepped portions SPdf and SPds have steeper shapes than the stepped portion SP, and the step length, that is, the length from the uppermost step to the lowermost step is shorter than the stepped portion SP.

By arranging the stepped portions SP, SPdf, and SPds in this manner, the stacked body LM has a shape recessed in a mortar shape in the stepped region SR. In this mortar-shaped region, the insulating layer 51 such as a silicon oxide layer is arranged so as to cover the upper surfaces of the stepped portions SP, SPdf, and SPds. The above-described insulating layers 52 and 53 also cover the upper surface of the insulating layer 51. Note that the insulating layer 51 constitutes a part of the insulating layer 49 in FIG. 1(a).

Here, FIG. 2B illustrates a cross section of the third step from the lowermost step of the stepped portion SP. That is, FIG. 2B illustrates a portion where the insulating layer OL immediately above the second word line WL from the lowermost word line WL is the terrace surface. In FIG. 2B, the stepped portions SP are arranged on both sides in the Y direction of the plate-like contact LI illustrated in the central portion of the stepped region SR. The stepped portion SPds is arranged beside each stepped portion SP on the opposite side of the plate-like contact LI in the Y direction.

That is, the semiconductor memory device 1 according to the first embodiment includes the plate-like contact LI as the first plate-like portion extending in the X direction on the outer side in the Y direction of the stepped portion SP, and the plate-like contact LI as the second plate-like portion extending in the X direction at a position between the two stepped portions SP and substantially overlapping the stepped portions SP.

A contact CC penetrating the insulating layers 52 and 51 and the insulating layer OL constituting the terrace surface of each step is connected to each of the word lines WL and the select gate lines SGD and SGS constituting each step of the stepped portion SP. The contact CC includes an insulating layer 54 covering the outer periphery of the contact CC and a conductive layer 21 such as a tungsten layer filling the inside of the insulating layer 54. The conductive layer 21 is connected to the upper layer wiring MX (see FIG. 1B) arranged in the further upper layer via the plug V0 arranged in the insulating layer 53. With such a configuration, the word lines WL and the select gate lines SGD and SGS of the respective layers can be electrically led out.

In addition, a plurality of columnar portions HRc is arranged in the stepped region SR including the stepped portions SP, SPdf, and SPds.

The plurality of columnar portions HRc is dispersedly arranged in the stepped region SR while avoiding interference with the contacts CC. Each of the columnar portions HRc has, for example, a circular shape, an elliptical shape, an oval shape, or the like as a cross-sectional shape in the direction along the XY plane.

Each of the plurality of columnar portions HRc is constituted by an insulating layer such as a silicon oxide layer extending in the stacked body LM in the stacking direction of the stacked body LM and reaching the source line SL, and does not contribute to the function of the semiconductor memory device 1. As described later, the columnar portions HRc have a role of supporting configurations when forming the stacked body LM from a stacked body in which sacrificial layers and insulating layers are stacked.

As illustrated in FIG. 2A, the through contact region TP includes an insulating region NR, and a plurality of through contacts C4 is arranged.

The insulating region NR has a configuration in which a plurality of insulating layers NL and a plurality of insulating layers OL are alternately stacked one by one. The plurality of insulating layers NL is, for example, a silicon nitride layer or the like, and is a sacrificial layer remaining without being replaced with the word line WL when the stacked body LM is formed from the stacked body in which the sacrificial layers and the insulating layers OL are stacked as described later.

The through contacts C4 are arranged in the insulating region NR. The through contacts C4 penetrate the insulating layer 52, the insulating layers NL and OL of the insulating region NR, and the source line SL, and reach the insulating layer 50 covering the peripheral circuit CUA (see FIG. 1A). Such a through contact C4 includes an insulating layer 56 covering the outer periphery of the through contact C4, and a conductive layer 23 such as a tungsten layer filling the inside of the insulating layer 56.

The conductive layer 23 is connected to the upper layer wiring MX (see FIG. 1B) arranged in the further upper layer via the plug V0 arranged in the insulating layer 53. As described above, the upper layer wiring MX is connected to the contact CC of the stepped portion SP belonging to the block region BLK adjacent in the Y direction, for example. In addition, the conductive layer 23 is connected to the peripheral circuit CUA via lower layer wiring D2 arranged in the insulating layer 50.

With the above configuration, a predetermined voltage is applied from the peripheral circuit CUA to the memory cells MC via the through contacts C4, the contacts CC, the word lines WL, and the like, and the memory cells MC can be operated as memory elements. Since the through contacts C4 include the insulating layer 56 and are arranged in the insulating region NR in which the insulating layers NL and OL are stacked, for example, occurrence of an electrical short circuit with the word lines WL or the like is suppressed.

Note that barriers (not illustrated) are arranged on both sides in the Y direction of the insulating region NR. Such a barrier is configured as a plate-like insulating member that extends in the X direction along the side surface of the insulating region NR in the X direction, penetrates the insulating layer 52 and the stacked body LM, and reaches the source line SL. As will be described later, the barrier prevents the insulating layers NL in the insulating region NR from being replaced with the word lines WL when the stacked body LM is formed from the stacked body in which the sacrificial layers and the insulating layers OL are stacked.

In addition, the plurality of columnar portions HRc described above is also dispersedly arranged in the through contact region TP while avoiding interference with the through contacts C4.

As illustrated in FIG. 2C, the dummy region SRd includes a stepped portion SPdx in which the plurality of word lines WL and the plurality of insulating layers OL are processed in a stepped shape and terminated at an end portion opposite to the memory region MR in the X direction. Similarly to the stepped portions SPdf and SPds arranged in the stepped region SR, the stepped portion SPdx is a dummy stepped portion that does not contribute to the function of the semiconductor memory device 1.

The stepped portion SPdx extends in the X direction and descends toward the outside of the stacked body LM, that is, in a direction away from the memory region MR. In the stepped portion SPdx, similarly to the stepped portions SPdf and SPds, the terrace portion of each step is shorter than the terrace portion of the stepped portion SP. Thus, the stepped portion SPdx has a steeper shape than the stepped portion SP, and the step length, that is, the length from the uppermost step to the lowermost step is shorter than the stepped portion SP.

However, for example, some of the plurality of word lines WL on the lower layer side may not extend to the end in the X direction of the stacked body LM. In addition, the select gate line SGS may not extend to the end in the X direction of the stacked body LM. In the layer in which the word line WL or the select gate line SGS does not reach the end, for example, the sacrificial layer may remain at the end portion position of the stacked body LM without being replaced with the conductive layer.

In such a case, in the stepped portion SPdx, one or a plurality of select gate lines SGD located above the plurality of word lines WL may be processed in a stepped shape and terminated. In addition, at least some of the word lines WL on the upper layer side of the plurality of word lines WL may be processed in a stepped shape and terminated. In addition, in the layers on the lower layer side, the word lines WL or the word lines WL and the select gate line SGS may transition to the sacrificial layers at substantially the same position in the X direction, and these sacrificial layers may terminate in a stepped shape at the end portion in the X direction of the stacked body LM.

The insulating layer 51 that covers the stepped portions SPdx and extends to a peripheral region PR on the outer side in the X direction of the stacked body LM is arranged at both end portions in the X direction of the stacked body LM. In addition, the dummy stepped portions as described above are also arranged at both end portions in the Y direction of the stacked body LM. The insulating layer 51 covers the stepped portions at both end portions in the Y direction and extends to the peripheral region on the outer side in the Y direction of the stacked body LM. The insulating layers 52 and 53 described above also cover the upper surface of the insulating layer 51 in the peripheral region PR of the stacked body LM.

In addition, the plate-like portion VT is arranged in the dummy region SRd closer to the memory region MR in the X direction than the stepped portion SPdx.

The plate-like portion VT extends in the stacking direction of the stacked body LM and the direction along the Y direction. That is, the plate-like portion VT penetrates the insulating layer 52 and the stacked body LM and reaches the source line SL. In addition, the plate-like portion VT extends in the direction along the Y direction in the dummy regions SRd and connects the end portions in the X direction of the plurality of plate-like contacts LI.

The plate-like portion VT has, for example, the same layer structure as the plate-like contacts LI. That is, the plate-like portion VT includes the insulating layer 55 covering the side walls facing each other in the X direction of the plate-like portion VT, and the conductive layer 22 filling the inside of the insulating layer 55.

In addition, a plurality of columnar portions HRm is arranged in the dummy region SRd including the stepped portion SPdx.

The columnar portions HRm as a plurality of second pillars are dispersedly arranged in the dummy region SRd while avoiding interference with the plate-like contacts LI and the plate-like portion VT. Each of the columnar portions HRm has, for example, a circular shape, an elliptical shape, an oval shape, or the like as a cross-sectional shape in the direction along the XY plane.

Each of the plurality of columnar portions HRm has, for example, the same layer structure as the pillars PL arranged in the memory region MR. That is, such a columnar portion HRm includes a dummy layer MEd and a dummy layer CNd extending in the stacked body LM in the stacking direction of the stacked body LM, and penetrates the stacked body LM to reach the source line SL.

Similarly to the memory layer ME of the pillar PL, the dummy layer MEd has a multilayer structure in which a plurality of insulating layers is stacked on the outer peripheral side of the columnar portion HRm. Similarly to the channel layer CN of the pillar PL, the dummy layer CNd is, for example, a semiconductor layer such as a polysilicon layer or an amorphous silicon layer, and is arranged inside the dummy layer MEd. In the columnar portion HRm, the dummy layer CNd is not arranged on the bottom surface of the columnar portion HRm, for example. A dummy layer CRd such as a silicon oxide layer is filled further inside the dummy layer CNd.

Similarly to the columnar portions HRc arranged in the stepped region SR, the columnar portions HRm do not contribute to the function of the semiconductor memory device 1, and have a role of supporting configurations when forming the stacked body LM from the stacked body in which the sacrificial layers and the insulating layers are stacked. Such columnar portions HRm may also be arranged, for example, in the stepped portions at both end portions in the Y direction of the stacked body LM.

Figure 3:
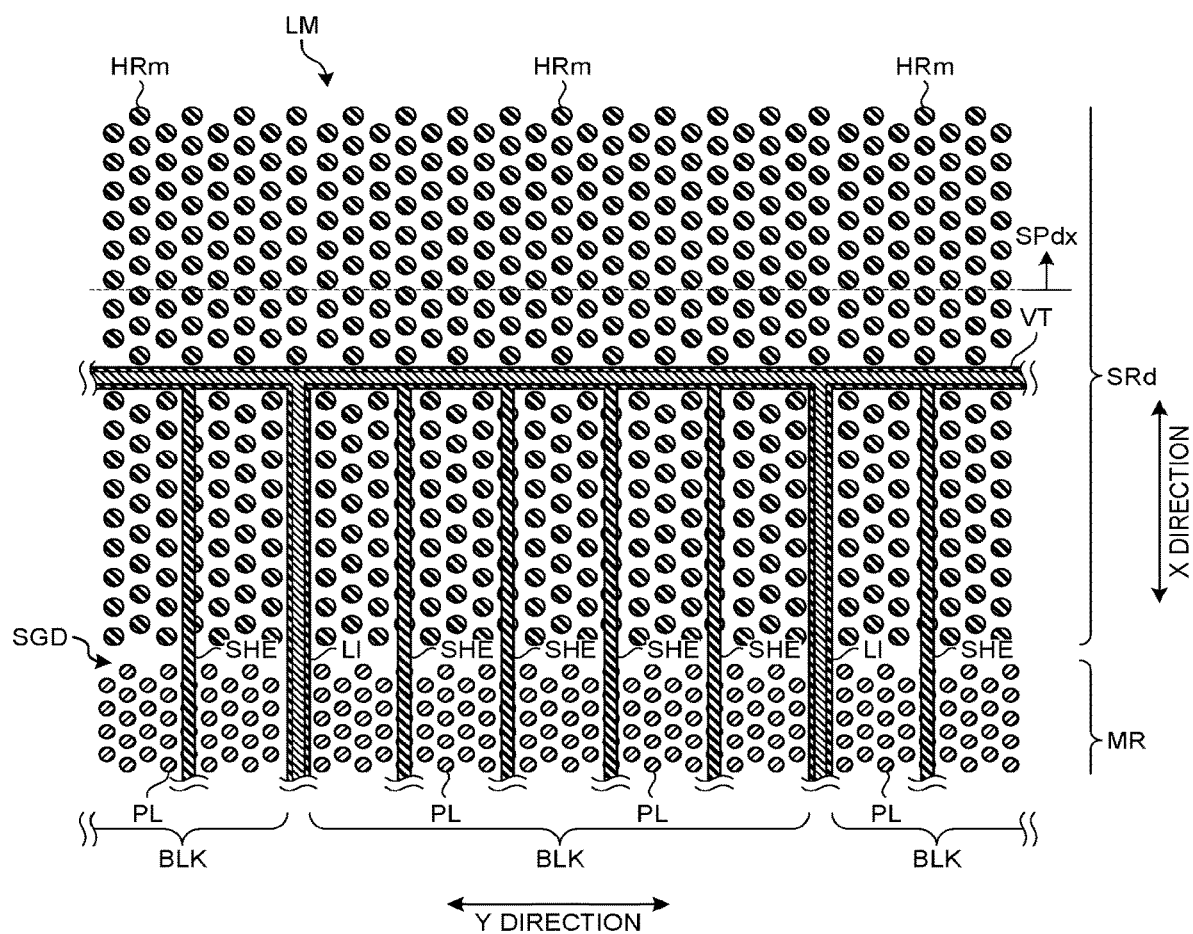
FIG. 3 is a partial cross-sectional view on the XY plane of the semiconductor memory device according to the first embodiment.

FIG. 3 is a partial cross-sectional view on the XY plane of the semiconductor memory device 1 according to the first embodiment. Specifically, FIG. 3 is a cross-sectional view along the XY plane at the height position of an arbitrary select gate line SGD formed in the stacked body LM included in the semiconductor memory device 1, and mainly illustrates the dummy region SRd on one side in the X direction of the stacked body LM.

As illustrated in FIG. 3, the plurality of plate-like contacts LI extends from the memory region MR to the dummy region SRd in the direction along the X direction at positions separated from each other in the Y direction. The plate-like portion VT extends in the direction along the Y direction in the dummy region SRd at a position closer to the memory region MR in the X direction than the stepped portion SPdx. In the dummy region SRd, the end portion in the X direction of the plurality of plate-like contacts LI is connected to the plate-like portion VT.

By arranging the plurality of plate-like contacts LI and the plate-like portion VT as described above, the stacked body LM of the memory region MR between the plate-like contacts LI adjacent in the Y direction is isolated from a part of the stacked body LM portion including the stepped portion SPdx in the dummy region SRd. That is, the plurality of plate-like contacts LI and the plate-like portion VT divide the stacked body LM excluding a part of the stacked body LM portion including the stepped portion SPdx in the Y direction. As a result, the plurality of block regions BLK between the plurality of plate-like contacts LI is electrically isolated from each other.

In addition, one or more isolation layers SHE are arranged between the plate-like contacts LI adjacent in the Y direction. Such an isolation layer SHE extends from the memory region MR to the dummy region SRd in the direction along the X direction, is connected to the plate-like portion VT, and terminates.

The isolation layer SHE is an insulating layer such as a silicon oxide layer penetrating the select gate line SGD included in the stacked body LM. In other words, among the plurality of conductive layers included in the stacked body LM, the uppermost conductive layer is penetrated by the isolation layer SHE, or the uppermost conductive layer and one or more conductive layers continuous with the uppermost conductive layer in the stacking direction of the stacked body LM are penetrated by the isolation layer SHE, whereby a part of the plurality of conductive layers included in the stacked body LM is selectively partitioned into the pattern of the select gate lines SGD arranged in the Y direction in one block region BLK.

In addition, the plurality of pillars PL in the memory region MR is arranged, for example, in a staggered manner when viewed from the stacking direction of the stacked body LM. At this time, the plurality of pillars PL is arranged at a position where interference with the plate-like contacts LI is avoided while maintaining a staggered periodic pattern. By arranging the plurality of pillars PL in a staggered manner, the arrangement density of the pillars PL per unit area of the word lines WL in the stacked body LM can be increased.

Note that the semiconductor memory device 1 is configured to allow interference between the pillars PL and the isolation layers SHE in order to maintain a staggered periodic pattern. That is, the isolation layers SHE may be arranged at positions overlapping with the pillars PL. In this case, the memory cells MC that function effectively are not formed in the pillars PL overlapping the isolation layers SHE.

In addition, the plurality of columnar portions HRm in the dummy region SRd is arranged, for example, in a staggered manner when viewed from the stacking direction of the stacked body LM while avoiding interference with the plate-like contacts LI and the plate-like portion VT. That is, the plurality of columnar portions HRm is arranged while maintaining the staggered arrangement except for positions overlapping the plate-like contacts LI and the plate-like portion VT when viewed from the stacking direction of the stacked body LM. Similarly to the pillars PL, the columnar portions HRm and the isolation layers SHE may interfere with each other.

The pitch between the plurality of columnar portions HRm is, for example, wider than the pitch between the plurality of pillars PL, and the arrangement density of the columnar portions HRm per unit area of the word lines WL in the stacked body LM is lower than the arrangement density of the pillars PL per unit area of the word lines WL. In addition, the area of the cross section of the columnar portion HRm along each layer of the stacked body LM is larger than, for example, the area of the cross section of the pillar PL along each layer of the stacked body LM.

As described above, for example, by configuring the cross-sectional area of the pillar PL to be smaller than that of the columnar portion HRm and making the pitch narrower, it is possible to form a large number of memory cells MC at high density in the stacked body LM having a predetermined size, and to increase the memory capacity of the semiconductor memory device 1. Meanwhile, since the columnar portions HRm are exclusively used to support the stacked body LM, the manufacturing load can be reduced by not having a precise configuration with a small cross-sectional area and a narrow pitch like the pillars PL, for example.

Note that the plurality of columnar portions HRc in the stepped region SR may be arranged, for example, in a staggered manner as viewed from the stacking direction of the stacked body LM, similarly to the columnar portions HRm in the dummy region SRd. That is, the plurality of columnar portions HRc may be arranged while maintaining the staggered arrangement except for positions overlapping the plate-like contacts LI and the contacts CC when viewed from the stacking direction of the stacked body LM.

In addition, the plurality of columnar portions HRm may also be dispersedly arranged, for example, in a staggered manner as viewed from the stacking direction of the stacked body LM in the stepped portions at both end portions in the Y direction of the stacked body LM.

(Method for Manufacturing Semiconductor Memory Device)

Next, a method for manufacturing the semiconductor memory device 1 according to the first embodiment will be described with reference to FIGS. 4A to 11C. FIGS. 4A to 11C are diagrams sequentially illustrating a part of the exemplary procedure of the method for manufacturing the semiconductor memory device 1 according to the first embodiment. Note that, it is assumed that the peripheral circuit CUA is formed on the substrate SB, the insulating layer 50 covering the peripheral circuit CUA is formed, and the source line SL covering the insulating layer 50 is formed before the processing illustrated in FIGS. 4A to 11C.

First, FIGS. 4A to 5B illustrate how the stepped portions SP are formed. FIGS. 4A to 5B illustrate a cross section along the Y direction of a region to be the stepped region SR later.

Figure 4A:
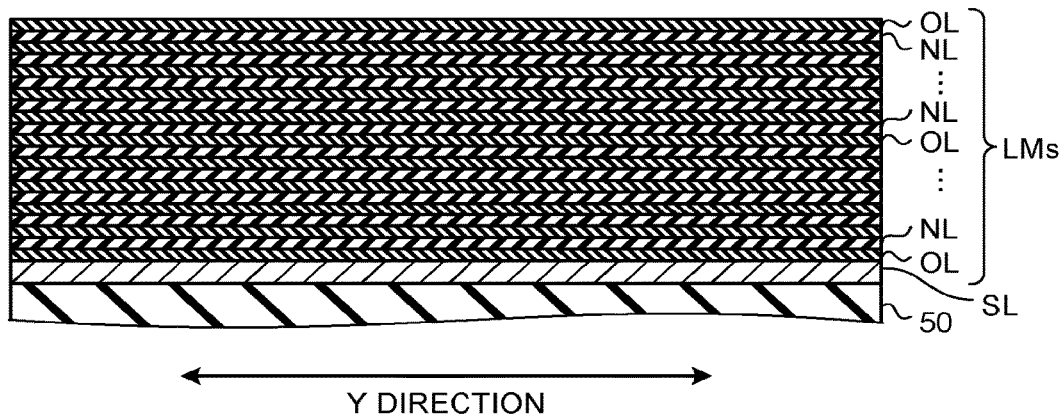
FIGS. 4A to 4C are diagrams sequentially illustrating a part of the exemplary procedure of a method for manufacturing the semiconductor memory device according to the first embodiment.

As illustrated in FIG. 4A, a stacked body LMs in which a plurality of insulating layers NL and a plurality of insulating layers OL are alternately stacked one by one is formed above the source line SL. The insulating layers NL are, for example, silicon nitride layers or the like, and function as sacrificial layers that are later replaced with conductive materials and become the word lines WL and the select gate lines SGD and SGS.

Figure 4B:
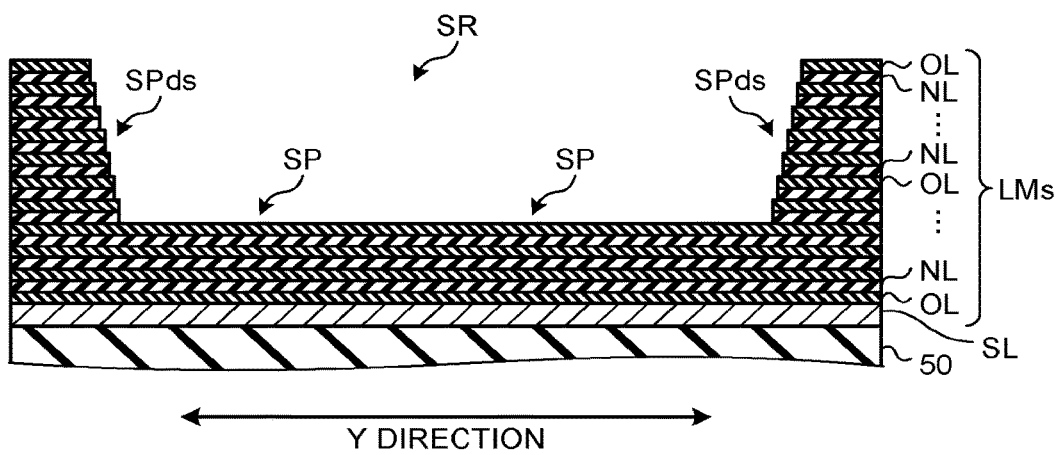

As illustrated in FIG. 4B, in a partial region of the stacked body LMs, the insulating layers NL and the insulating layers OL are dug down in a stepped shape to form the stepped portion SP. The stepped portion SP is formed by repeating slimming of a mask pattern such as a photoresist layer and etching of the insulating layers NL and the insulating layers OL of the stacked body LMs a plurality of times.

That is, a mask pattern having an opening at a formation position of the stepped portion SP is formed on the upper surface of the stacked body LMs, and for example, the insulating layers NL and the insulating layers OL are etched away one by one. In addition, the mask pattern end portion of the opening is retracted to widen the opening by processing with oxygen plasma or the like, and the insulating layers NL and the insulating layers OL are further etched away one by one. By repeating such processing a plurality of times, the insulating layers NL and the insulating layers OL in the opening of the mask pattern are dug down in a stepped shape.

In addition, every time the above processing is repeated for a predetermined number of times, a mask pattern is newly formed again such that the layer thickness of the mask pattern is maintained at a predetermined value or more. At this time, by adjusting the position of the opening of the mask pattern, the stepped portion SP that is relatively gently inclined and the steep stepped portions SPdf and SPds are formed. Similarly, by adjusting the end portion positions of the mask pattern at both end portions in the X direction and both end portions in the Y direction of the stacked body LMs, the steep stepped portions SPdx and the like are formed at the four end portions of the stacked body LMs, similarly to the stepped portions SPdf and SPds.

FIG. 4B is a cross-sectional view of the third step from the lowermost step of the stepped portion SP formed in this manner. The cross section illustrated in FIG. 4B is isolated into two stepped portions SP by the plate-like contact LI to be formed later. In addition, the stepped portion SPds is formed on one side in the Y direction of the stacked body LMs of each stepped portion SP.

Figure 4C:
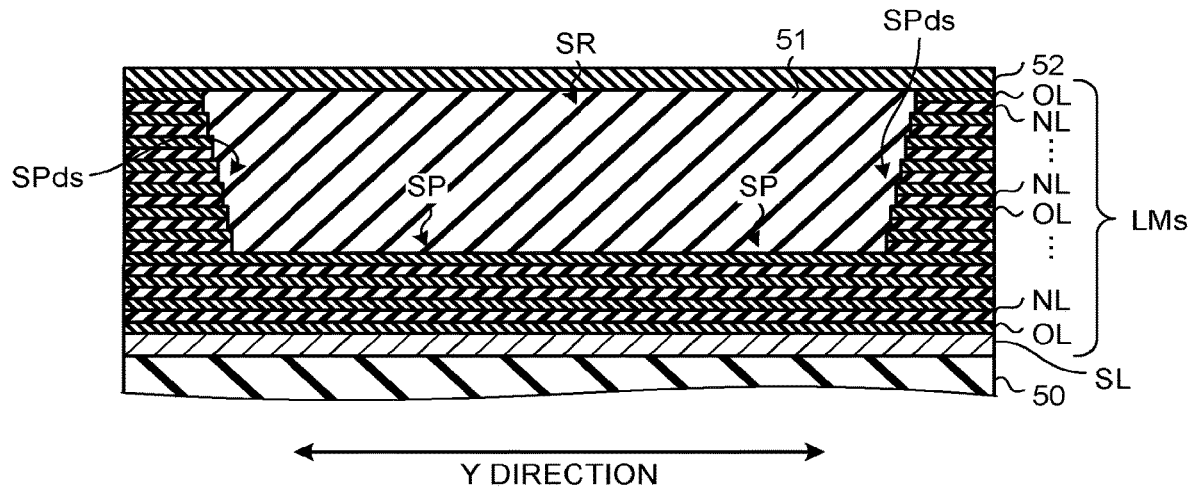

As illustrated in FIG. 4C, the insulating layer 51 such as a silicon oxide layer covering the stepped portion SP and reaching the height of the upper surface of the stacked body LMs is formed. That is, the insulating layer 51 is formed in a mortar-shaped region surrounded by the stepped portions SP, SPds, and SPdf. In addition, the insulating layer 51 is also formed in the peripheral region PR (see FIG. 2C) of the stacked body LMs having the stepped portion SPdx and the like at the end portion. In addition, the insulating layer 52 that covers the upper surface of the stacked body LMs and the upper surface of the insulating layer 51 is further formed.

Figure 5A:
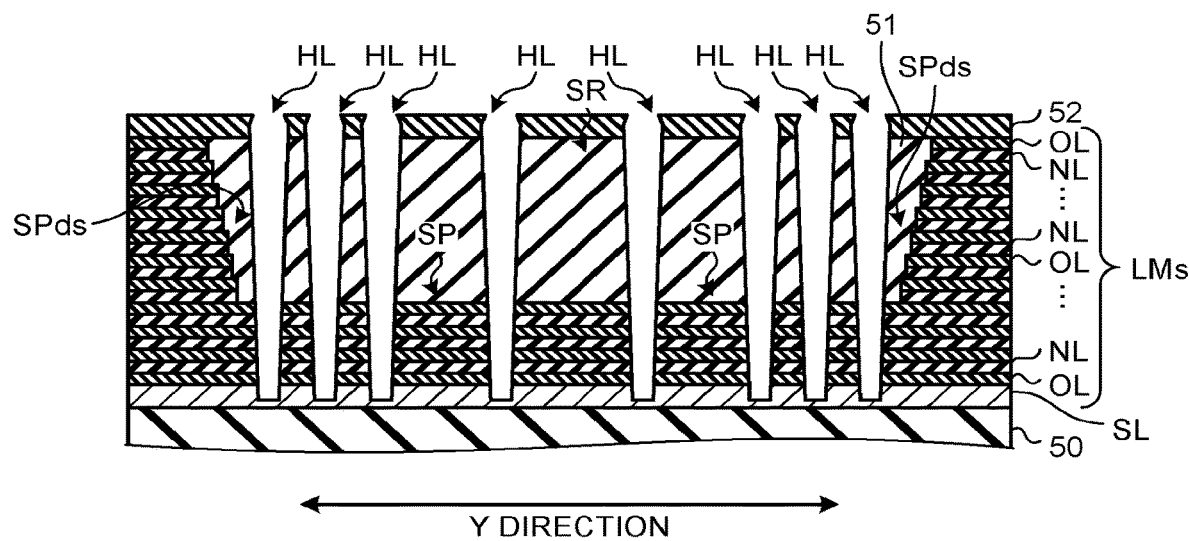
FIGS. 5A and 5B are diagrams sequentially illustrating a part of the exemplary procedure of the method for manufacturing the semiconductor memory device according to the first embodiment.

As illustrated in FIG. 5A, a plurality of holes HL penetrating through the insulating layers 52 and 51 and the stacked body LMs and reaching the source line SL is formed in a mortar-shaped region surrounded by the stepped portions SP, SPds, and SPdf.

Figure 5B:
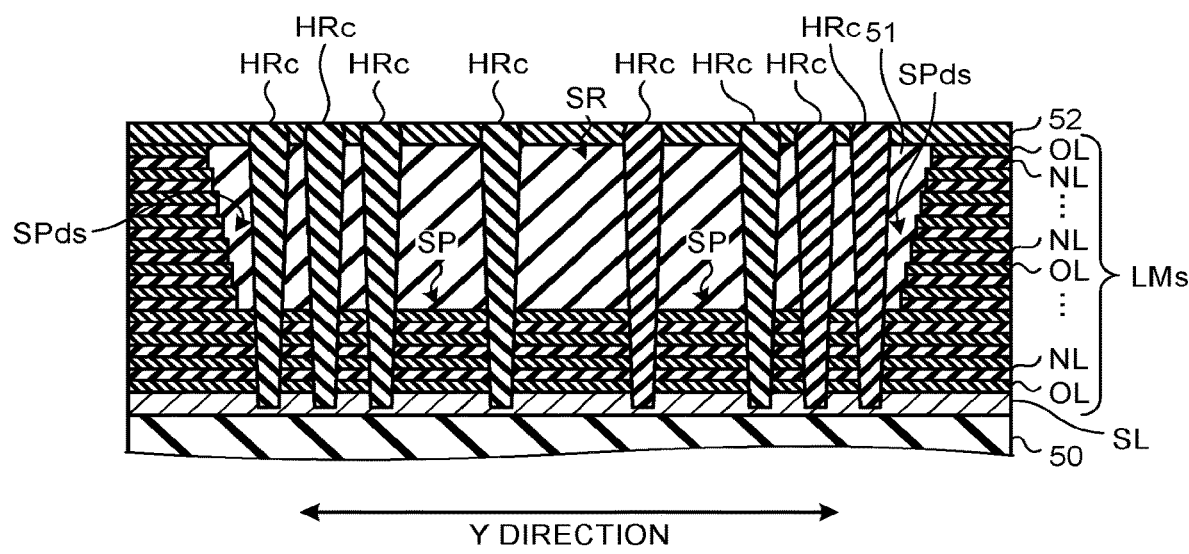

As illustrated in FIG. 5B, the holes HL are filled with insulating layers such as silicon oxide layers, and a plurality of columnar portions HRc is formed.

Next, FIGS. 6A to 7C illustrate how the pillars PL are formed.

FIGS. 6A to 7C illustrate a cross section along the Y direction of a region to be the memory region MR later. However, as described above, since the pillar PL has a circular shape, an elliptical shape, an oval shape, or the like, the pillar PL has a similar cross-sectional shape regardless of the direction of the cross section.

Figure 6A:
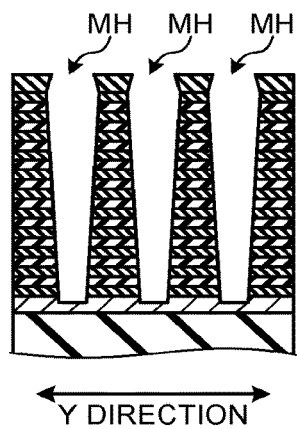
FIGS. 6A to 6C are diagrams sequentially illustrating a part of the exemplary procedure of the method for manufacturing the semiconductor memory device according to the first embodiment.

As illustrated in FIG. 6A, also in the region where the memory region MR is to be formed, the stacked body LMs is formed above the source line SL and the insulating layer 52 is formed on the stacked body LMs by the above-described various processes. In this state, a plurality of memory holes MH penetrating the insulating layer 52 and the stacked body LMs and reaching the source line SL is formed.

Figure 6B:
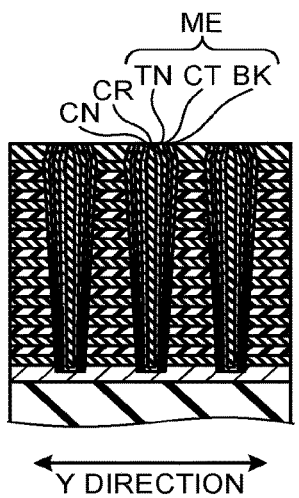

As illustrated in FIG. 6B, in such a memory hole MH, a memory layer ME in which a block insulating layer BK, a charge trap layer CT, and a tunnel insulating layer TN are stacked in order from the outer peripheral side of the memory hole MH is formed. As described above, the block insulating layer BK and the tunnel insulating layer TN are, for example, silicon oxide layers or the like, and the charge trap layer CT is, for example, a silicon nitride layer or the like.

The memory layer ME is also formed on the bottom surface of the memory hole MH and then removed.

In addition, a channel layer CN such as a polysilicon layer or an amorphous silicon layer is formed inside the tunnel insulating layer TN. The channel layer CN is also formed on the bottom surface of the memory hole MH. In addition, a core layer CR such as a silicon oxide layer is filled further inside the channel layer CN.

Figure 6C:
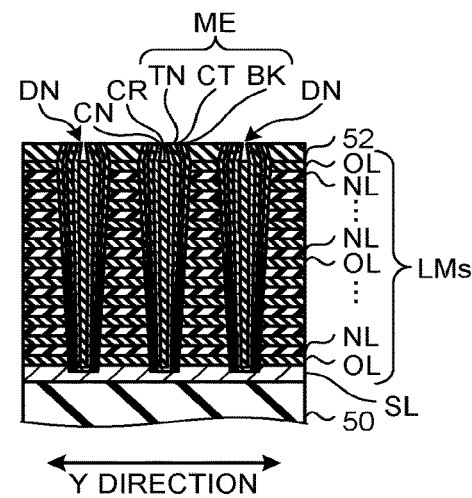

As illustrated in FIG. 6C, the core layer CR exposed on the upper surface of the insulating layer 52 is etched away to a predetermined depth to form a recess DN.

Figure 7A:
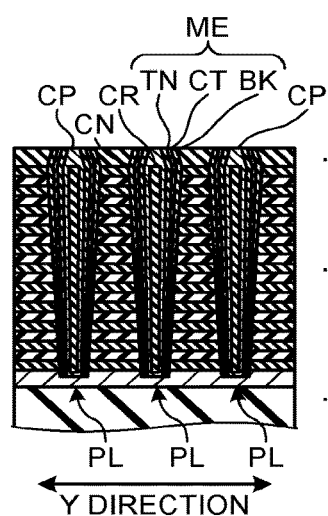
FIGS. 7A to 7C are diagrams sequentially illustrating a part of the exemplary procedure of the method for manufacturing the semiconductor memory device according to the first embodiment.

As illustrated in FIG. 7A, the inside of the recess DN is filled with a polysilicon layer, an amorphous silicon layer, or the like to form a cap layer CP. As a result, the plurality of pillars PL is formed.

Figure 7B:
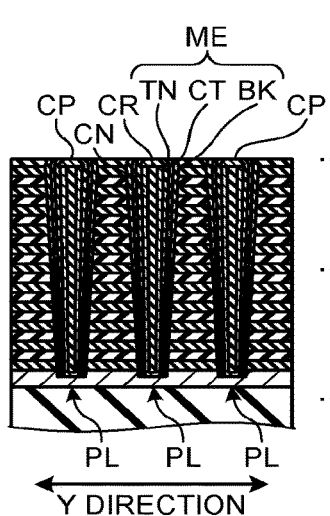

As illustrated in FIG. 7B, the insulating layer 52 is etched back together with the upper surface of the cap layer CP. As a result, the thickness of the cap layer CP decreases.

Figure 7C:
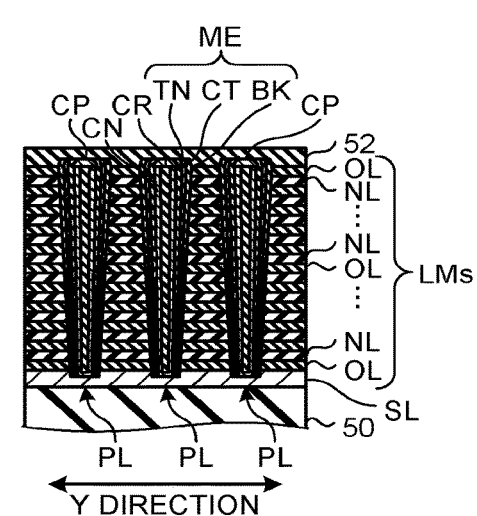

As illustrated in FIG. 7C, the insulating layer 52 thinned by etch-back is stacked back. As a result, the upper surface of the cap layer CP is covered with the insulating layer 52.

In addition, the columnar portions HRm (see FIG. 2C) are formed in the dummy regions SRd in parallel with the process of forming the pillars PL in FIGS. 6A to 7C. The columnar portions HRm are formed by substantially the same process as the process of forming the pillars PL.

However, in the process of forming the columnar portions HRm, processes corresponding to the process of removing the memory layer ME on the bottom surfaces of the pillars PL and the process of forming the cap layers CP on the upper end portions of the pillars PL may not be performed. During these processes to the pillars PL, for example, by protecting the dummy regions SRd with a mask layer or the like, these processes can be skipped in the step of forming the columnar portions HRm.

Note that the order of the process of forming the stepped portions SP in FIGS. 4B and 4C, the process of forming the columnar portions HRc in FIGS. 5A and 5B, and the process of forming the pillars PL in FIGS. 6A to 7C can be interchanged.

Figure 8A:
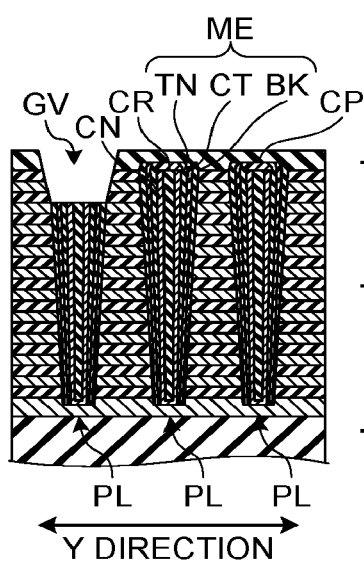
FIGS. 8A and 8B are diagrams sequentially illustrating a part of the exemplary procedure of the method for manufacturing the semiconductor memory device according to the first embodiment.
Figure 8B:
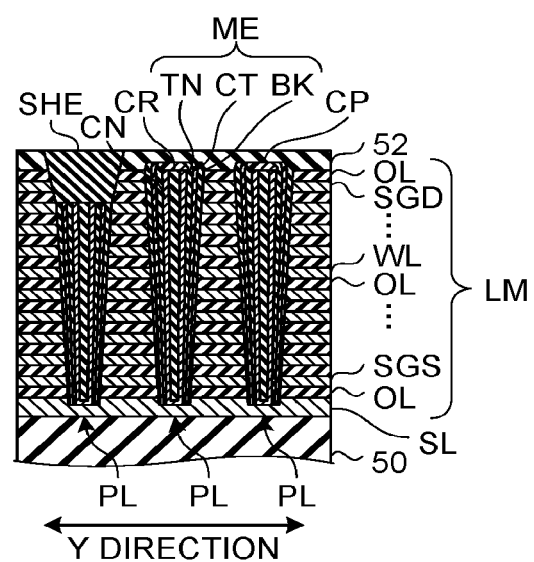

Next, FIGS. 8A and 8B illustrate a state in which the isolation layer SHE is formed. Similarly to FIGS. 6A to 7C, FIGS. 8A and 8B illustrate a cross section along the Y direction of a region to be the memory region MR.

After replacement processing to be described later is performed on the stacked body LMs in FIGS. 7A to 7C, as illustrated in FIG. 8A, in the stacked body LM, a groove GV penetrating one or more conductive layers including at least the uppermost layer corresponding to the select gate line SGD and extending in the direction along the X direction is formed. At this time, depending on the arrangement of the plurality of pillars PL and the density of the pillars PL, the formation positions of some pillars PL and the formation positions of grooves GV may overlap with each other. For example, this is because a space for forming the groove GV may not be provided in the arrangement of the plurality of pillars PL so as not to disturb the periodicity of the staggered arrangement pattern of the pillars PL.

The upper end portion of the pillar PL overlapping the formation position of the groove GV is partially or entirely lost by the groove GV, and the pillar PL becomes a dummy pillar that does not form the memory cells MC that effectively function.

As illustrated in FIG. 8B, the groove GV is filled with an insulating layer such as a silicon oxide layer. As a result, the isolation layer SHE that isolates at least the uppermost conductive layer in the stacked body LM is formed. The conductive layer isolated by the isolation layer SHE forms a pattern in which a plurality of select gate lines SGD is arranged in the Y direction above the word lines WL not isolated by the isolation layer SHE.

Note that the process of forming the isolation layer SHE in FIGS. 8A and 8C may be performed at another timing as long as the timing is after the process of forming the pillars PL in FIGS. 6A to 7C. For example, depending on the number of the isolation layers SHE arranged between the plate-like contacts LI adjacent in the Y direction, it is also allowable to form the isolation layers SHE before the replacement processing of the stacked body LMs to be described later.

Next, FIGS. 9A to 11C illustrate how the insulating layers NL are replaced with the word lines WL.

A of FIGS. 9A to 11C illustrates a cross section of the stepped region SR along the Y direction, and corresponds to FIG. 2B. B of FIGS. 9A to 11C illustrates a cross section of the dummy region SRd along the X direction, and corresponds to FIG. 2C. C of FIGS. 9A to 11C is a cross-sectional view of the XY plane including the dummy region SRd of the stacked body LMs, and correspond to FIG. 3 except that the height position of an arbitrary word line WL is indicated instead of the height position of the select gate line SGD.

Figure 9A:
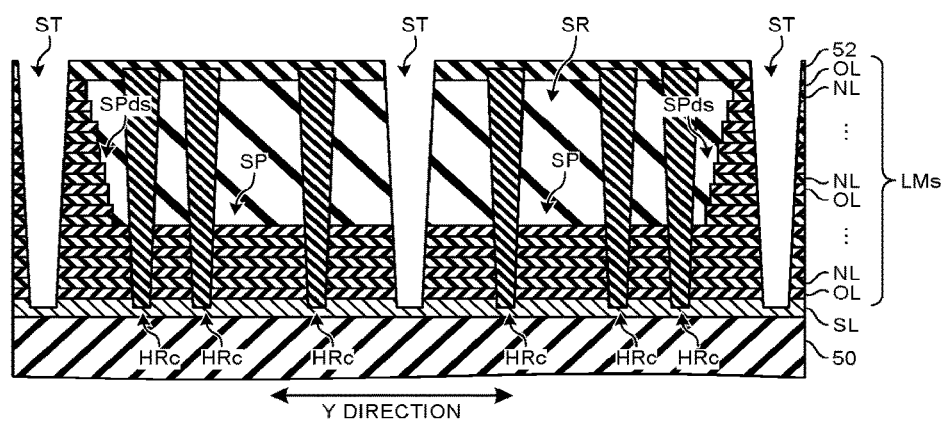
FIGS. 9A to 9C are diagrams sequentially illustrating a part of the exemplary procedure of the method for manufacturing the semiconductor memory device according to the first embodiment.

As illustrated in FIG. 9A, also in the stepped region SR, after the above-described processing illustrated in FIG. 5B, the upper end portions of the columnar portions HRc are etched back, the insulating layer 52 is stacked back, and the upper surfaces of the columnar portions HRc are covered with the insulating layer 52 by the processing of FIGS. 6A to 7C.

Figure 9B:
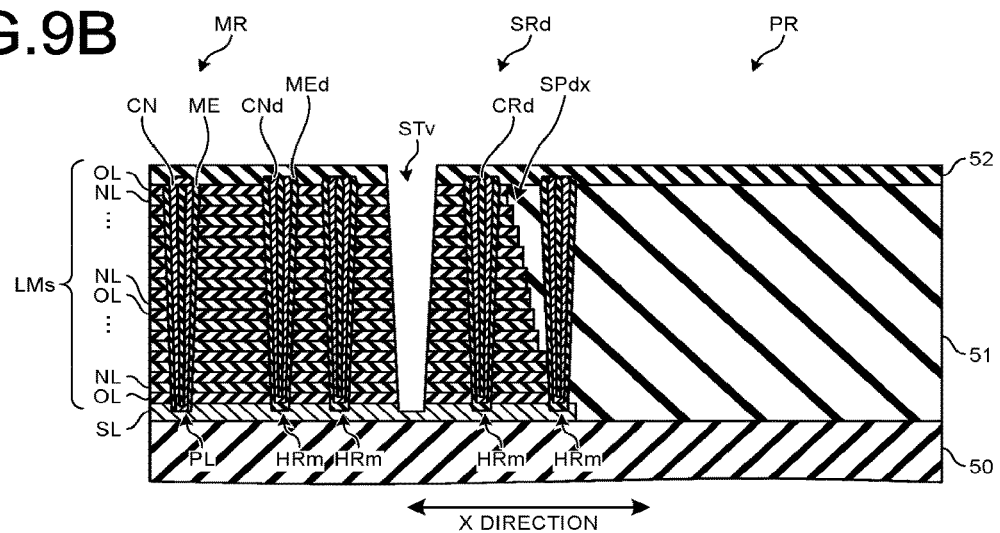
Figure 9C:
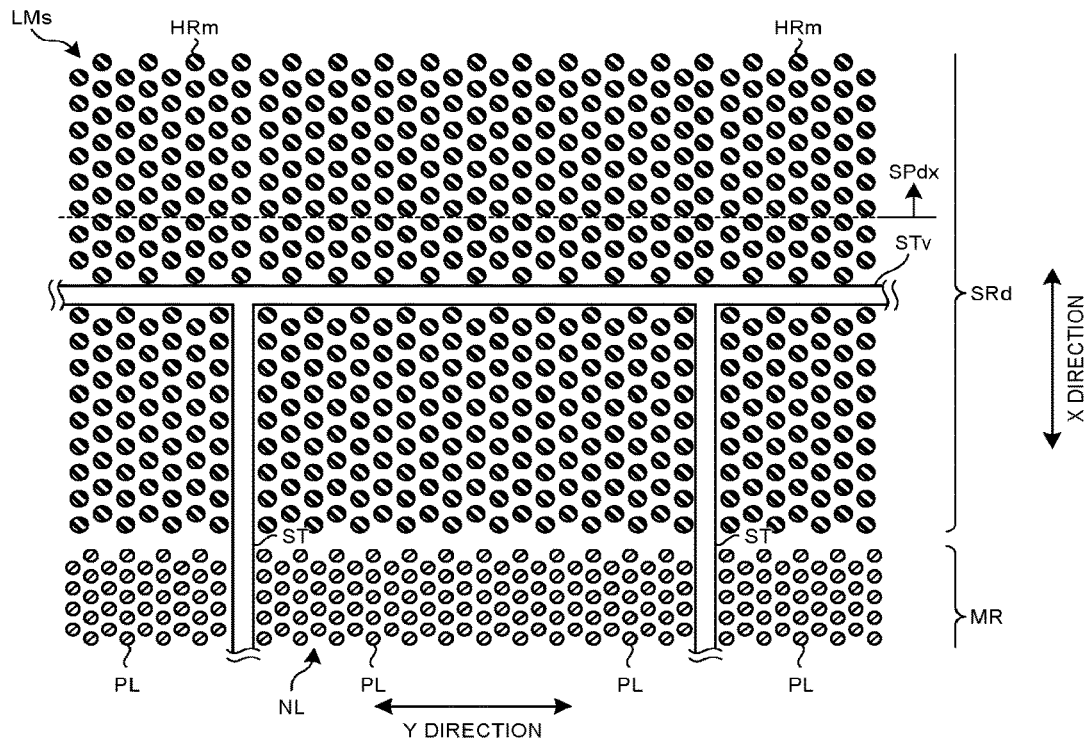

As illustrated in FIGS. 9B and 9C, in the dummy region SRd, the columnar portions HRm having the same layer structure as the pillars PL are formed by the processing of FIGS. 6A to 7C. That is, the columnar portion HRm includes the dummy layer MEd having a multilayer structure made of the same materials as the block insulating layer BK, the charge trap layer CT, and the tunnel insulating layer TN of the pillar PL, in order from the outer peripheral side of the columnar portion HRm.

In addition, the columnar portion HRm has a configuration in which the dummy layer CNd is provided inside the dummy layer MEd, and the dummy layer CRd is filled further inside the dummy layer CNd. The dummy layers CNd and CRd are made of the same material as the channel layer CN and the core layer CR of the pillar PL, respectively.

However, the bottom surface of the columnar portion HRm is covered with the dummy layer MEd, and for example, the dummy layer CNd is not in contact with the source line SL. In addition, the columnar portion HRm does not have a configuration corresponding to the cap layer CP of the pillar PL, for example.

As illustrated in FIGS. 9A and 9C, a plurality of slits ST extending in the direction along the X direction in the stacked body LMs across the memory region MR, the stepped region SR, and the dummy region SRd is formed at a position separated in the Y direction. The plurality of slits ST penetrates the insulating layers 52 and 51 and the stacked body LMs in each region and reaches the source line SL.

In addition, as illustrated in FIG. 9B, in parallel with the formation of the plurality of slits ST, a slit STv extending in the direction along the Y direction in the stacked body LMs is formed at a position closer to the memory region MR in the X direction than the stepped portion SPdx in the dummy region SRd. At this time, the end portion in the X direction of the plurality of slits ST is connected to the side surface of the slit STv on the memory region MR side. The slit STv penetrates the insulating layer 52 and the stacked body LMs in the dummy region SRd and reaches the source line SL.

These slits ST and STv are formed at positions where interference with the pillars PL and the columnar portions HRm does not occur.

Figure 10A:
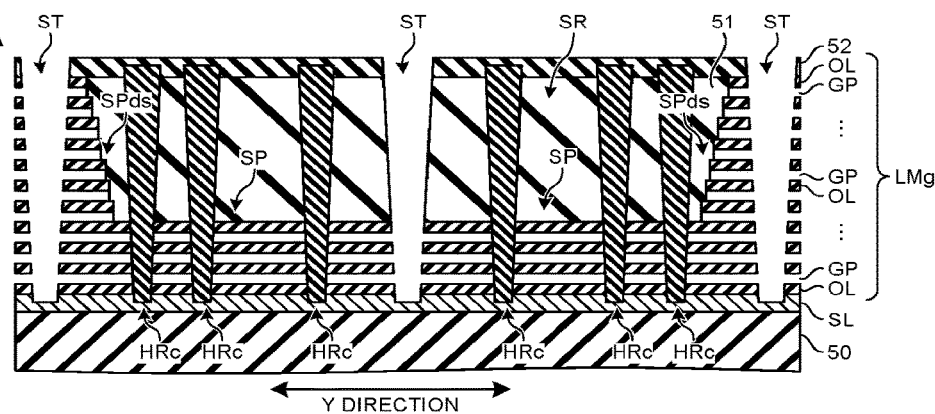
FIGS. 10A to 10C are diagrams sequentially illustrating a part of the exemplary procedure of the method for manufacturing the semiconductor memory device according to the first embodiment.
Figure 10B:
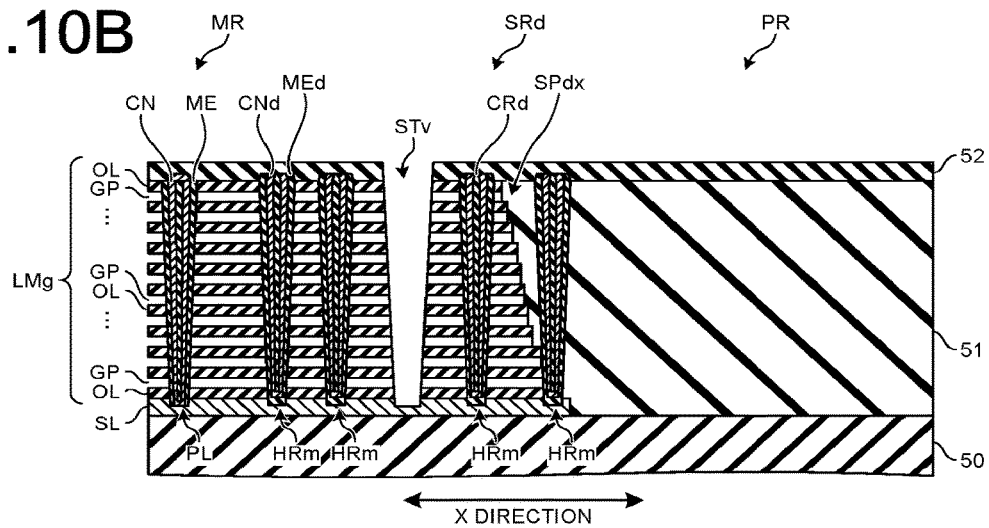
Figure 10C:
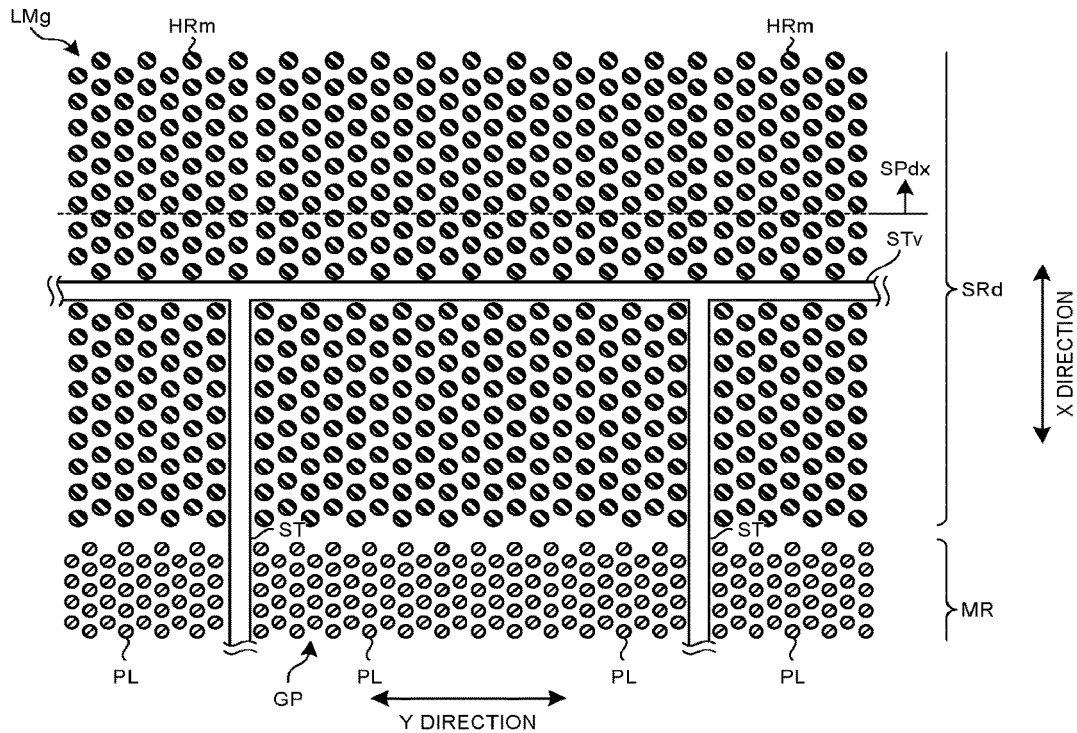

As illustrated in FIGS. 10A and 10B, a removing liquid of the insulating layers NL such as thermal phosphoric acid is caused to flow into the stacked body LMs from the slits ST and STv to remove the insulating layers NL of the stacked body LMs. As a result, a stacked body LMg having the plurality of gap layers GP from which the insulating layers NL between the insulating layers OL are removed is formed.

The stacked body LMg including the plurality of gap layers GP has a fragile structure. In the memory region MR, the plurality of pillars PL supports such a fragile stacked body LMg. In the dummy region SRd, the plurality of columnar portions HRm supports the stacked body LMg. The plurality of columnar portions HRm supports the stacked body LMg also in the stepped portions and the like at both end portions in the Y direction of the stacked body LMg. In the stepped region SR, the plurality of columnar portions HRc supports the stacked body LMg.

Such support structures of the pillars PL and the columnar portions HRm and HRc suppress bending of the remaining insulating layers OL and distortion and collapse of the stacked body LMg.

Note that, for example, some of the insulating layers NL on the lower layer side may remain at both end portions in the X direction of the stacked body LMg. The removing liquid flows into both end portions in the X direction of the stacked body LMg exclusively through the slit STv. This is because the removing liquid may not reach the ends of the insulating layers NL arranged in a direction away from the slit STv, that is, on the lower layer side, and some of the insulating layers NL may remain without being removed at the end portions in the X direction of the stacked body LMg.

Figure 11A:
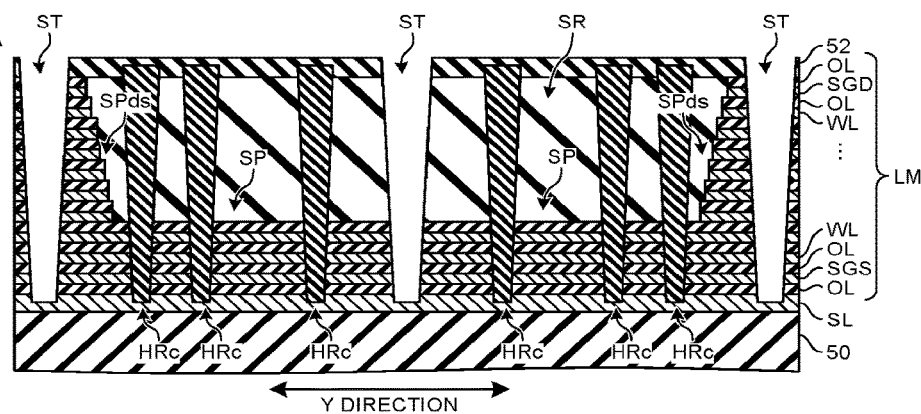
FIGS. 11A to 11C are diagrams sequentially illustrating a part of the exemplary procedure of the method for manufacturing the semiconductor memory device according to the first embodiment.
Figure 11B:
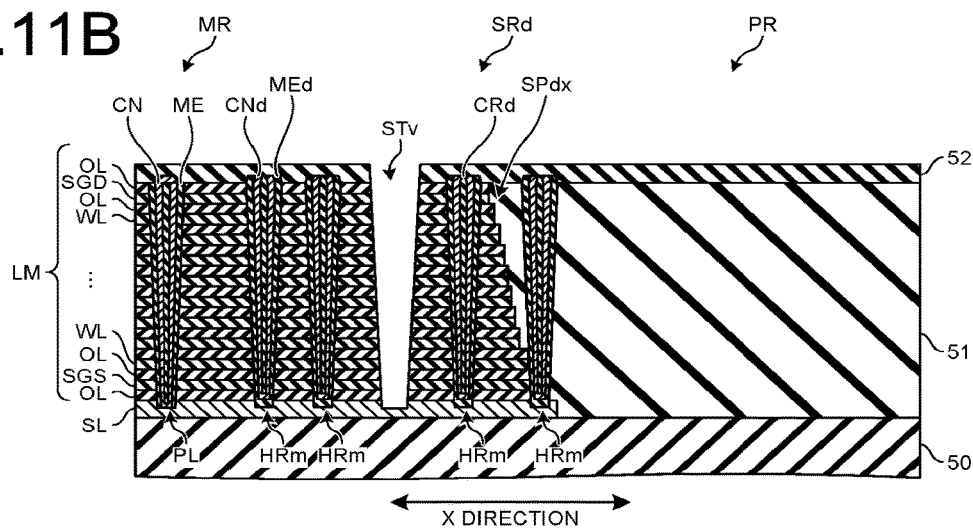
Figure 11C:
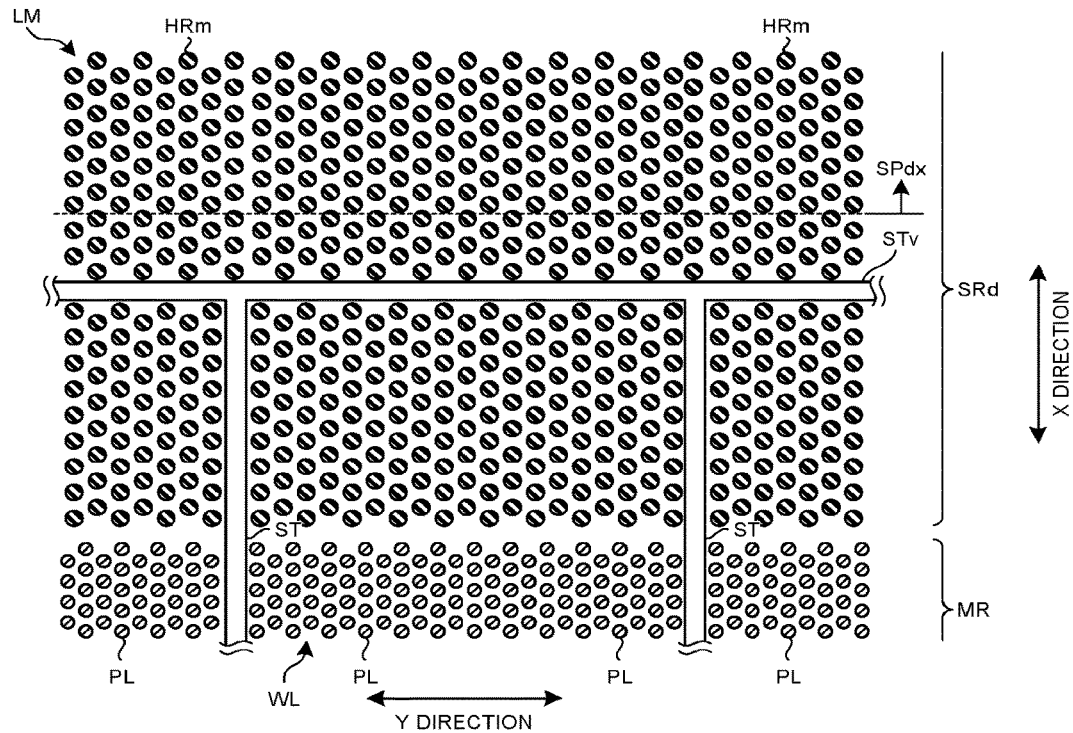

As illustrated in FIGS. 11A and 11B, a source gas of conductor such as tungsten or molybdenum is injected from the slits ST and STv into the stacked body LMg, and the gap layers GP of the stacked body LMg are filled to form the plurality of word lines WL and select gate lines SGD and SGS.

As a result, the stacked body LM in which the plurality of word lines WL and the plurality of insulating layers OL are alternately stacked one by one, and the select gate lines SGD and SGS is further included is formed.

Note that, when some of the insulating layers NL remain at both end portions in the X direction of the stacked body LMg, the source gas is not injected into the portions, and the word lines WL or the select gate lines SGS are not formed. Thus, in the stepped portion SPdx, one or a plurality of select gate lines SGD on the upper layer side may be formed in a stepped shape, or at least some of the word lines WL on the upper layer side may be formed in a stepped shape in addition to the select gate lines SGD, and the remaining insulating layers NL may constitute both end portions of the stacked body LM in the X direction in a stepped shape in layers below the select gate lines SGD.

The formation of the word lines WL and the select gate lines SGD and SGS from the insulating layers NL illustrated in FIGS. 10A to 11C may be referred to as replacement processing.

Note that, at the time of the replacement processing, for example, replacement of the insulating layers NL with the word lines WL and the select gate lines SGD and SGS is inhibited in a partial region of the stacked body LMs, for example, and the above-described through contact region TP (see FIG. 2A) is formed.

In order to inhibit the replacement in the through contact region TP, as described above, for example, a method of providing barriers such as silicon oxide layers on both sides in the Y direction of the through contact region TP can be adopted. As a result, the removing liquid of the insulating layers NL and the source gas of the conductive layers are inhibited from flowing into the through contact region TP from the slits ST on both sides in the Y direction.

Thereafter, the insulating layer 55 is formed on the side walls of the slits ST and STv, and the conductive layer 22 is filled inside the insulating layer 55 to form the plate-like contacts LI and the plate-like portion VT, respectively. In addition, a hole reaching the uppermost word line WL belonging to the step is formed in each step of the stepped portion SP, the insulating layer 54 is formed on the side wall of the hole, and the conductive layer 21 is filled inside the insulating layer 54 to form the contact CC connected to each of the plurality of word lines WL. In addition, the through contact C4 electrically connected to the peripheral circuit CUA below the stacked body LM is formed in the through contact region TP.

In addition, the insulating layer 53 is formed on the insulating layer 52, and the plug V0 is formed to penetrate the insulating layer 53 and be connected to each of the plate-like contacts LI, the through contacts C4, and the contacts CC. In addition, the plug CH connected to the pillar PL is formed through the insulating layers 53 and 52. Further, the upper layer wiring MX and the bit line connected to the plugs V0 and CH, respectively, are formed.

As described above, the semiconductor memory device 1 according to the first embodiment is manufactured.

In a manufacturing process of a semiconductor memory device such as a three-dimensional nonvolatile memory, for example, a plurality of slits for dividing a stacked body is formed in order to electrically isolate a plurality of block regions including a memory region. These slits extend, for example, in the X direction from the center of the stacked body to the outer sides of both end portions of the stacked body, and divide the stacked body in the Y direction.

Here, in the dummy stepped portions arranged at both end portions in the X direction of the stacked body, the slit width at the upper position of the stepped portion may be increased for the following reason.

As the stepped portion descends toward the peripheral region of the stacked body, the thickness of the stacked body in the height direction decreases, and the thickness of the insulating layer covering the stepped portion increases. As compared with a stacked body having a multilayer structure, for example, an insulating layer having a single layer structure is a layer having relatively low hardness.

Thus, when the thickness of the insulating layer instead of the stacked body is equal to or more than a certain value in the stepped portion, the slit width may become larger than the design value at the height position of the insulating layer, and the plate-like contact formed from the slit may have a tapered shape in which the upper end portion is widened or a bowing shape in which the middle portion is widened. As a result, the plate-like contact may come into contact with the columnar portion arranged around the plate-like contact.

In order to avoid contact between the plate-like contacts and the columnar portions, for example, it is conceivable to lower the arrangement density of the columnar portions to secure the distance to the plate-like contacts. However, in this case, for example, in replacement processing or the like, the columnar portions may not sufficiently support the stacked body, and the insulating layers stacked in the stacked body may be bent not to sufficiently secure spaces for forming the word lines, or the stacked body may be distorted or collapsed.

Alternatively, for example, it is conceivable to configure the columnar portions with insulating layers such as silicon oxide layers such that the electrical characteristics are not affected even if the plate-like contacts and the columnar portions come into contact with each other. However, in this case, the columnar portions cannot be collectively formed with the pillars in the memory region, so the manufacturing process of the semiconductor memory device may become complicated, and the manufacturing cost may increase.

According to the semiconductor memory device 1 according to the first embodiment, the plate-like contacts LI adjacent in the Y direction are connected to each other and terminated in the dummy region SRd. As a result, the plurality of block regions BLK can be electrically isolated from each other without arranging the plate-like contacts LI, for example, in the stepped portion SPdx at the end portions in the X direction of the stacked body LM.

Thus, it is possible to suppress the increase of the widths of the slits ST and STv and to suppress the contact with the columnar portions HRm arranged in the dummy region SRd including the stepped portion SPdx, for example. In addition, since the risk of contact with the plate-like contacts LI is reduced, the arrangement density of the columnar portions HRm in the dummy region SRd can be increased to suppress the deflection of the insulating layers OL in the stacked body LMg and the distortion and collapse of the stacked body LMg.

According to the semiconductor memory device 1 according to the first embodiment, each of the plurality of columnar portions HRm has the same layer structure as each of the plurality of pillars PL. Such a configuration is possible by reducing the risk of contact between the columnar portions HRm and the plate-like contacts LI as described above.

By making the columnar portions HRm and the pillars PL have the same layer structure, for example, they can be collectively formed. Thus, the manufacturing process can be simplified and the manufacturing cost can be reduced. In addition, by having a multilayer structure like the pillars PL, the strength of the columnar portions HRm can be increased, and the stacked body LMg can be more firmly supported.

(Modification)

Next, a semiconductor memory device 1a according to a modification of the first embodiment will be described with reference to FIGS. 12A and 12B. The semiconductor memory device 1a according to the modification is different from that of the first embodiment in that the plate-like portion VT connecting the plurality of plate-like contacts LI is arranged in the stepped portion SPdx.

Figure 12A:
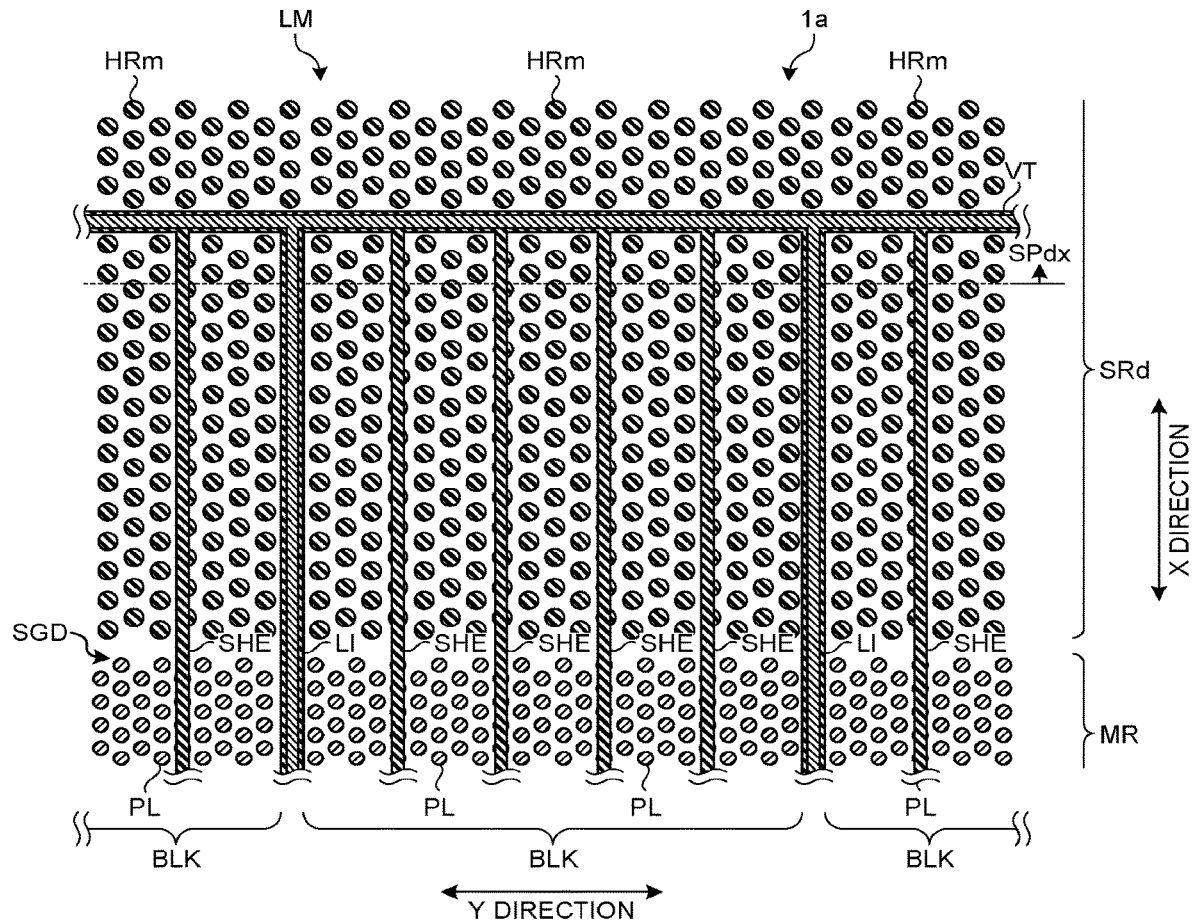
FIGS. 12A and 12B are diagrams illustrating an example of a configuration of a semiconductor memory device according to a modification of the first embodiment.
Figure 12B:
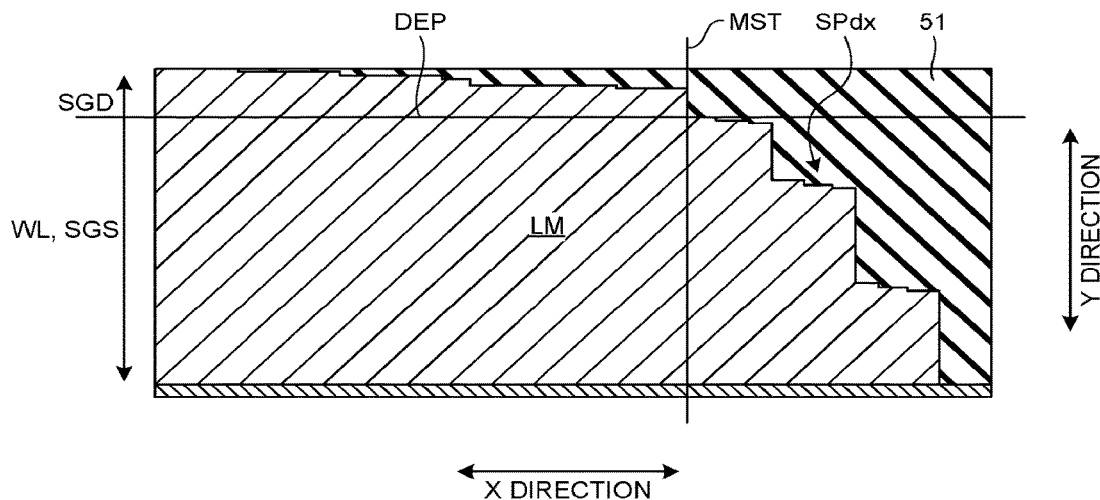

FIGS. 12A and 12B are diagrams illustrating an example of a configuration of the semiconductor memory device 1a according to the modification of the first embodiment. Note that, in the semiconductor memory device 1a according to the modification, the same components as those of the semiconductor memory device 1 according to the first embodiment described above are denoted by the same references, and the description thereof will be omitted.

FIG. 12A is a cross-sectional view of the XY plane including the dummy region SRd in the stacked body LM of the semiconductor memory device 1a according to the modification, and corresponds to FIG. 3 of the first embodiment described above. As illustrated in FIG. 12A, the plate-like contacts LI adjacent in the Y direction are indirectly connected to each other in the stepped portion SPdx via the plate-like portion VT arranged in the stepped portion SPdx and terminate.

Also in the above configuration of the semiconductor memory device 1a according to the modification, the stacked body LM in the memory region MR is isolated from a part of the stacked body LM portion in the stepped portion SPdx by the plate-like contacts LI and the plate-like portion VT.

FIG. 12B is a schematic cross-sectional view of the stepped portion SPdx along the X direction, and illustrates the relationship between the arrangement position of the plate-like portion VT and the depth position of the isolation layer SHE. In the example of FIG. 12B, the isolation layer SHE reaches a depth indicated by a line segment DEP in the drawing in the stacked body LM. That is, in the stacked body LM, an upper layer from the line segment DEP is the select gate line SGD, and lower layers from the line segment DEP are the word lines WL and the select gate line SGS.

In this case, the plate-like portion VT in the stepped portion SPdx is arranged at a position indicated by a line segment MST or a position closer to the memory region MR in the X direction than the line segment MST. That is, the plate-like portion VT is arranged such that at least a part in the width direction of the plate-like portion VT overlaps the step where any one of the one or more select gate lines SGD are led out.

In other words, the plate-like portion VT is arranged such that at least a part in the width direction of the plate-like portion VT overlaps a terminal portion in the X direction of the lowermost select gate line SGD among the one or more select gate lines SGD or a portion in the stepped portion SPdx in the dummy region SRd corresponding to the closer point to the memory region MR in the X direction than the terminal portion.

The above-described increase in the slit width in the stepped portion becomes remarkable in the vicinity where the insulating layer covering the stepped portion becomes thicker than the thickness on the step where the lowermost select gate line is led out. In the semiconductor memory device 1a according to the modification, the slits to be the plate-like contacts LI are connected to the slit to be the plate-like portion VT and terminated before the thickness of the insulating layer 51 exceeds the thickness on the step where the lowermost select gate line SGD is led out. Thus, the increase in the width of the slit can be suppressed.

According to the semiconductor memory device 1a according to the modification, the same effects as those of the semiconductor memory device 1 according to the first embodiment described above are obtained.

Second Embodiment

Hereinafter, a second embodiment will be described in detail with reference to the drawings. In the semiconductor memory device according to the second embodiment, the shape of the terminal portion of the plate-like contact near the end portion in the X direction of the stacked body is different from that of the first embodiment.

(Configuration Example of Plate-Like Contact)

Figure 13:
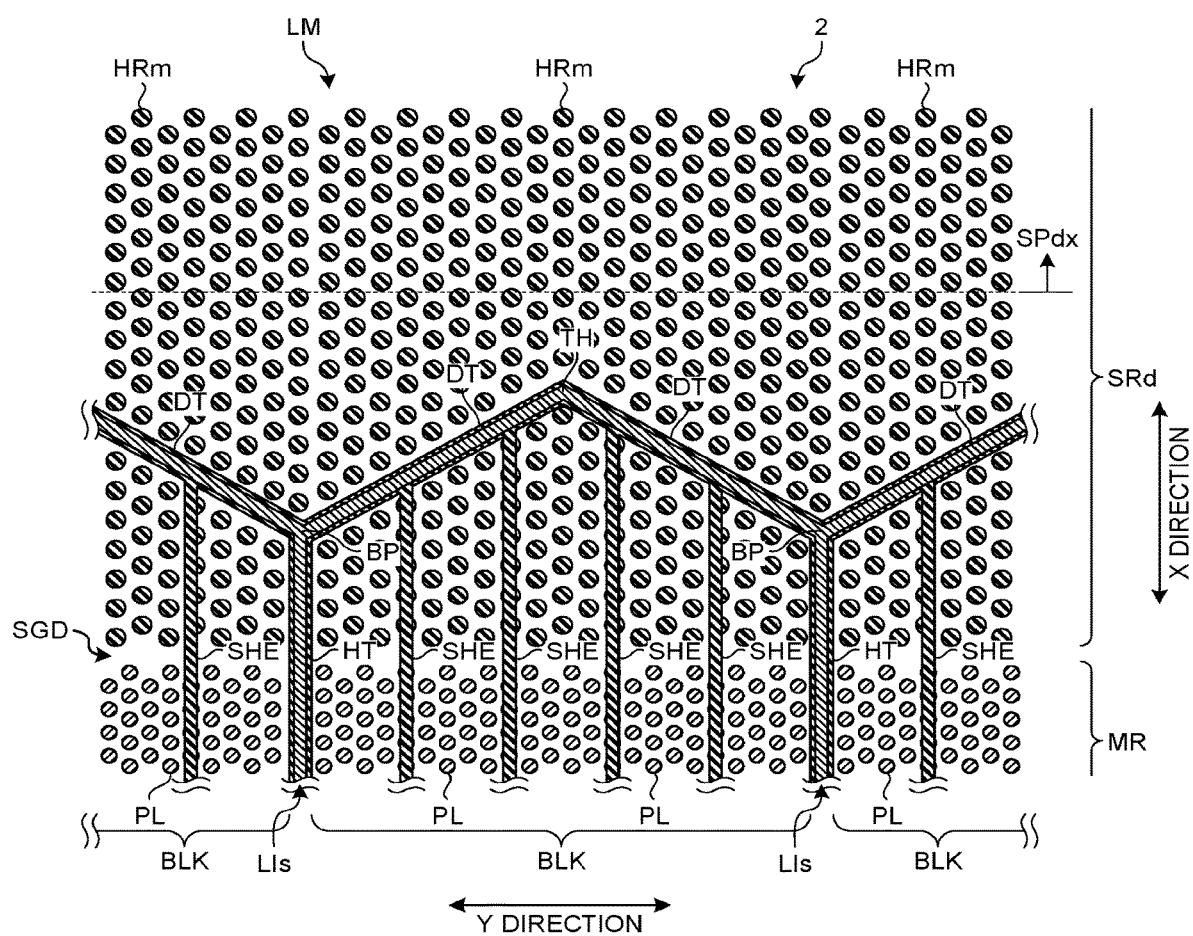
FIG. 13 is a diagram illustrating an example of a configuration of a semiconductor memory device according to a second embodiment.

FIG. 13 is a diagram illustrating an example of a configuration of a semiconductor memory device 2 according to the second embodiment. More specifically, FIG. 13 is a cross-sectional view of the XY plane including the dummy region SRd in the stacked body LM of the semiconductor memory device 2, and corresponds to FIG. 3 of the first embodiment described above. Note that, in the semiconductor memory device 2 according to the second embodiment, the same components as those of the semiconductor memory device 1 according to the first embodiment described above are denoted by the same references, and the description thereof will be omitted.

As illustrated in FIG. 13, in the semiconductor memory device 2, the two plate-like contacts LIs as the first and second plate-like portions adjacent to each other in the Y direction and extending in the X direction in the memory region MR are directly connected and terminated by extending to be inclined with respect to the X direction so as to approach each other at a position in the dummy region SRd.

More specifically, one plate-like contact LIs includes a plurality of portions HT, DT, DT and a bent portion BP.

The portion HT extends in the direction along the X direction in the memory region MR. One portion DT of the two portions DT included in one plate-like contact LIs is connected to the corresponding portion HT, and extends to be inclined with respect to the X direction so as to approach another plate-like contact LIs adjacent to the plate-like contact LIs on one side in the Y direction at a position in the dummy region SRd. The other portion DT of the two portions DT is connected to the corresponding portion HT, and extends to be inclined with respect to the X direction so as to approach still another plate-like contact LIs adjacent to the plate-like contact LIs on the other side in the Y direction at a position in the dummy region SRd.

The inclination angle of the portion DT is set in accordance with, for example, the arrangement pattern of the columnar portions HRm in the dummy region SRd. As a result, the portion DT extends in the dummy region SRd along the arrangement direction of the plurality of columnar portions HRm adjacent to the portion DT.

The bent portion BP is a portion bent from the portion HT to two portions DT. Since the portions DT are arranged diagonally, the angle formed by the portions HT and DT at the bent portion BP is an obtuse angle.

In addition, the two plate-like contacts LIs adjacent in the Y direction share a connection portion TH in which the portions DT extending to be inclined so as to approach each other are connected. For example, the connection portion TH is arranged closer to the memory region MR in the X direction than the stepped portion SPdx in the dummy region SRd. An angle formed by the two portions DT at the connection portion TH is an obtuse angle.

As described above, the plate-like contact LIs of the semiconductor memory device 2 includes the portions DT extending so as to connect the portion HT adjacent to each other in the Y direction while bending at an obtuse angle at a position in the dummy region SRd. As a result, the stacked body LM of the memory region MR is isolated from a part of the stacked body LM portion opposite to the memory region MR in the X direction of the dummy region SRd, and the stacked body LM excluding the stacked body LM portion of the dummy region SRd is divided in the Y direction.

In the etching processing using plasma, for example, ions in the plasma are likely to concentrate in a portion where the plurality of slits is orthogonal to each other, and the width of the orthogonal portion is likely to be increased or the reaching depth is likely to be excessively deep. When the slit width increases, there is a concern of contact with the columnar portions as described above, and when the slit depth becomes too deep, there is a possibility that the plate-like contacts penetrate the source line and come into contact with the structure of the lower layers.

According to the semiconductor memory device 2 according to the second embodiment, the angle formed by the portions HT and DT and the angle formed by the two portions DT sharing the connection portion TH are obtuse angles. As a result, it is possible to further suppress the increase of the slit width and to suppress the variation in the reaching depth of the slits.

According to the semiconductor memory device 2 according to the second embodiment, the plate-like contact LIs includes the portion DT extending so as to connect the portion HT adjacent in the Y direction while bending at an obtuse angle at a position in the dummy region SRd. As a result, for example, when the semiconductor memory device 2 is cut into a chip shape, it is possible to suppress occurrence of chip breakage or the like along the plate-like contacts LIs.

According to the semiconductor memory device 2 according to the second embodiment, the portion DT extends along the arrangement direction of the columnar portions HRm adjacent to the portion DT. As a result, the staggered pattern of the columnar portions HRm can be more reliably maintained, and the distance between the plate-like contacts LIs and the columnar portions HRm adjacent to the plate-like contacts LIs can be easily kept substantially constant. Thus, at the time of the replacement processing, it is possible to further suppress the deflection of the insulating layers OL and the distortion and collapse of the stacked body LMg.

According to the semiconductor memory device 2 according to the second embodiment, other effects similar to those of the first embodiment described above are obtained.

(First Modification)

Next, a semiconductor memory device 2a according to a first modification of the second embodiment will be described with reference to FIG. 14. In the semiconductor memory device 2a according to the first modification, the position of the terminal portion of a plate-like contact LIa in the dummy region SRd is different from that of the second embodiment.

Figure 14:
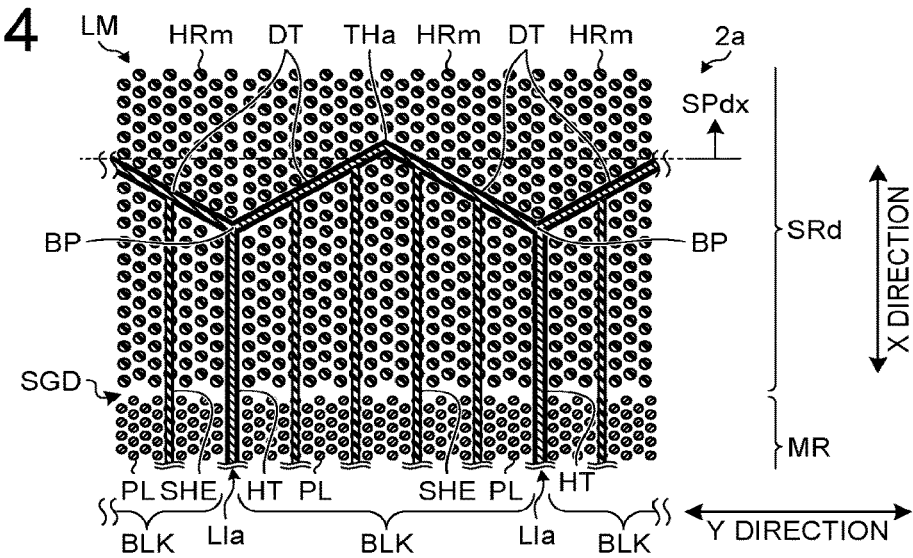
FIG. 14 is a diagram illustrating an example of a configuration of a semiconductor memory device according to a first modification of the second embodiment.

FIG. 14 is a diagram illustrating an example of a configuration of the semiconductor memory device 2a according to the first modification of the second embodiment. More specifically, FIG. 14 is a cross-sectional view of the XY plane including the dummy region SRd in the stacked body LM of the semiconductor memory device 2a, and corresponds to FIG. 13 of the second embodiment described above.

As illustrated in FIG. 14, in the semiconductor memory device 2a, a connection portion THa where the respective portions DT of two plate-like contacts LIa adjacent in the Y direction are connected to each other is arranged in the stepped portion SPdx.

More specifically, the connection portion THa is arranged such that at least a part of the connection portion THa overlaps a step where any one of the one or more select gate lines SGD are led out. In other words, the connection portion THa is arranged such that at least a part of the connection portion THa overlaps a terminal portion in the X direction of the lowermost select gate line SGD among the one or more select gate lines SGD or a portion in the stepped portion SPdx in the dummy region SRd corresponding to the closer point to the memory region MR in the X direction than the terminal portion.

As described above, also in the above-described configuration of the semiconductor memory device 2a according to the first modification, the stacked body LM of the memory region MR is isolated from a part of the stacked body LM portion in the stepped portion SPdx by the plate-like contacts LIa.

According to the semiconductor memory device 2a according to the first modification, effects similar to those of the second embodiment described above are obtained.

(Second and Third Modifications)

Next, semiconductor memory devices 2b and 2c according to second and third modifications of the second embodiment will be described with reference to FIGS. 15 and 16. The semiconductor memory devices 2b and 2c according to the second and third modifications are different from that of the second embodiment described above in that plate-like contacts LIb and LIc are terminated by the plate-like portion VT in the dummy region SRd.

Figure 15:
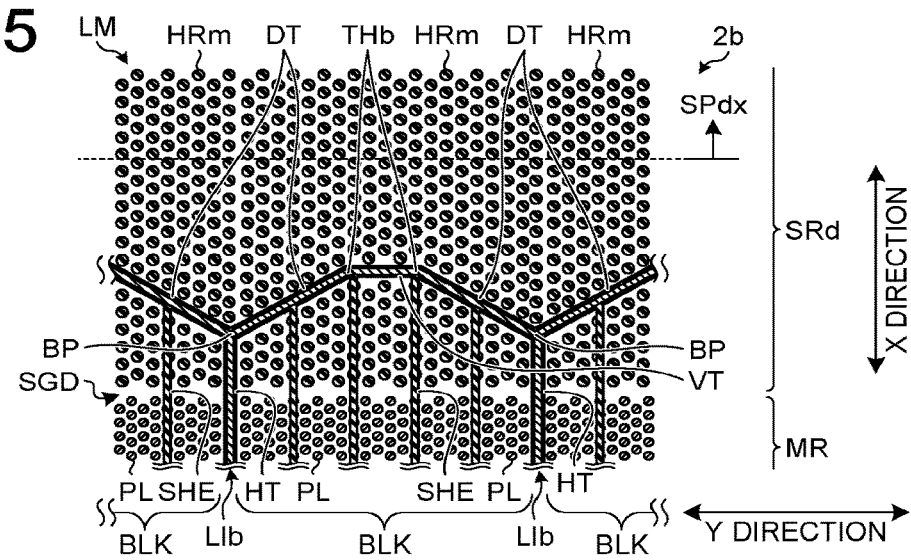
FIG. 15 is a diagram illustrating an example of a configuration of a semiconductor memory device according to a second modification of the second embodiment.

FIG. 15 is a diagram illustrating an example of a configuration of the semiconductor memory device 2b according to the second modification of the second embodiment. FIG. 16 is a diagram illustrating an example of a configuration of the semiconductor memory device 2c according to the third modification of the second embodiment. More specifically, FIGS. 15 and 16 are cross-sectional views of the XY plane including the dummy region SRd in the stacked body LM of the semiconductor memory devices 2b and 2c, and correspond to FIG. 13 of the second embodiment described above.

As illustrated in FIG. 15, the semiconductor memory device 2b according to the second modification includes the plate-like portion VT extending in the stacking direction and the direction along the Y direction in the stacked body LM in the dummy region SRd. The plate-like portion VT is arranged closer to the memory region MR in the X direction than the stepped portion SPdx in the dummy region SRd. The respective portions DT of the plurality of plate-like contacts LIb are indirectly connected and terminated by the plate-like portion VT in the dummy region SRd.

That is, the plate-like portion VT is arranged at a position corresponding to between a plurality of plate-like contacts LIb in the Y direction, and two portions DT extending to be inclined with respect to the X direction are connected so as to approach each other. Thus, one plate-like contact LIb includes a connection portion THb to which the portion DT and the plate-like portion VT are connected, instead of the connection portion TH to which the portions DT are connected. In the connection portion THb, an angle formed by the portion DT and the plate-like portion VT is an obtuse angle.

Note that the position of the plate-like portion VT in the X direction can be changed within the dummy region SRd.

Figure 16:
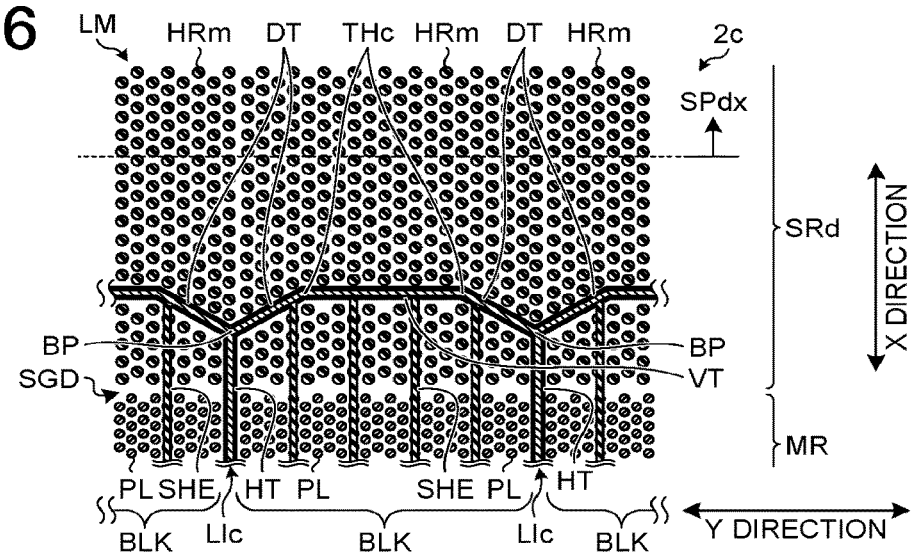
FIG. 16 is a diagram illustrating an example of a configuration of a semiconductor memory device according to a third modification of the second embodiment.

As illustrated in FIG. 16, in the semiconductor memory device 2c according to the third modification, the plate-like portion VT is arranged closer to the memory region MR than in the second modification. As a result, a connection portion THc of the plate-like contact LIc at the end portion of the portion DT is also arranged further closer to the memory region MR.

According to the semiconductor memory devices 2b and 2c according to the second and third modifications, the two plate-like contacts LIb or LIc adjacent in the Y direction include the plate-like portion VT that connects the portions DT extending to be inclined with respect to the X direction so as to approach each other. As a result, the connection portions THb and THc having larger angles than the connection portion TH to which the portions DT are connected are formed. Thus, it is possible to further suppress the increase of the slit width and to suppress the variation in the reaching depth.

According to the semiconductor memory devices 2b and 2c according to the second and third modifications, other effects similar to those of the second embodiment described above are obtained.

Note that, also in the configurations of the second and third modifications, the plate-like portion VT extending in the Y direction in the dummy region SRd may be arranged in the stepped portion SPdx. In this case, the plate-like portion VT may be arranged such that at least a part of the plate-like portion VT overlaps a terminal portion of the lowermost select gate line SGD among the one or more select gate lines SGD or a portion in the stepped portion SPdx in the dummy region SRd corresponding to the closer point to the memory region MR in the X direction than the terminal portion.

Other Embodiments

Hereinafter, other embodiments will be described with reference to the drawings as necessary.
(Modification of Stepped Region)

Figure 17:
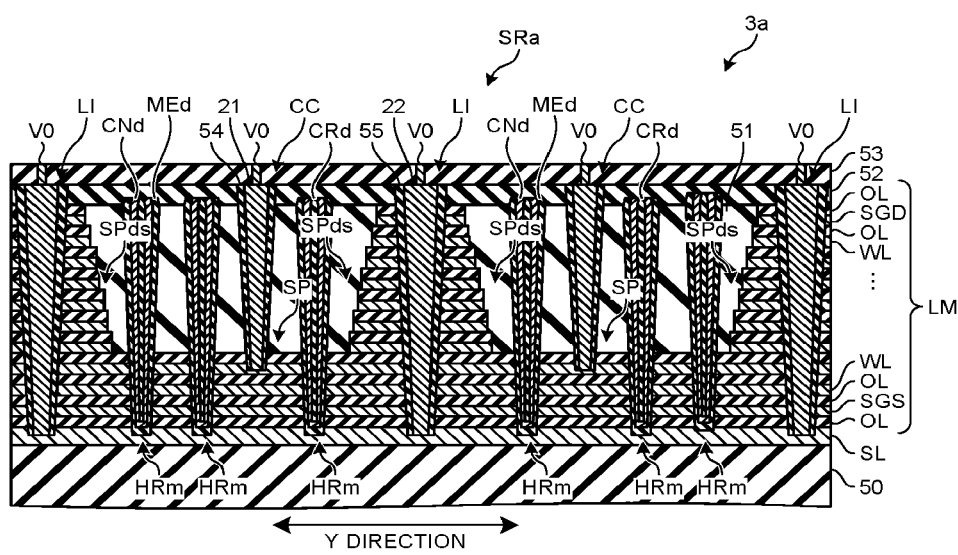
FIG. 17 is a cross-sectional view in a direction along the Y direction illustrating an example of a configuration of a stepped region of a semiconductor memory device according to another embodiment.
Figure 18:
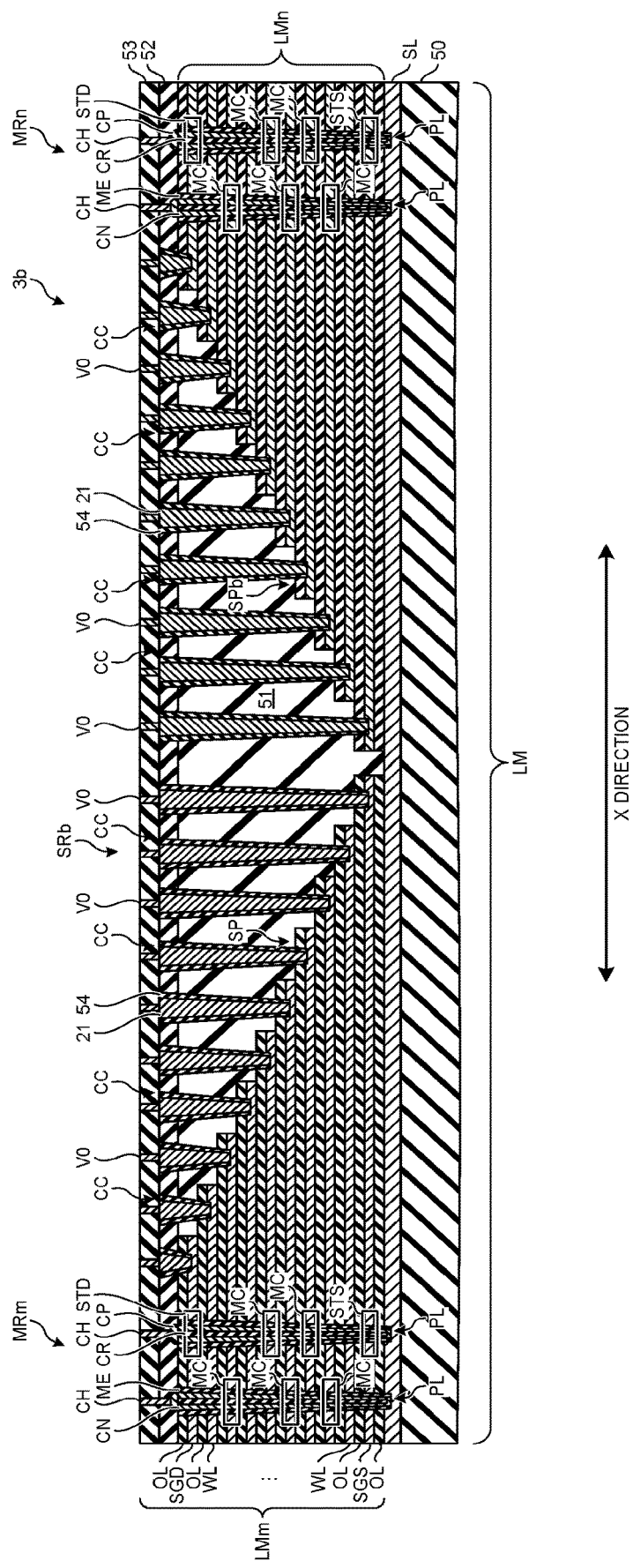
FIG. 18 is a cross-sectional view in a direction along the X direction illustrating an example of a configuration of a stepped region of a semiconductor memory device according to another embodiment.

The semiconductor memory device may include a stepped region having a different configuration instead of the above-described configuration of the stepped region SR. FIGS. 17 and 18 illustrate configuration examples of semiconductor memory devices 3a and 3b respectively including stepped regions SRa and SRb having different configurations.

FIG. 17 is a cross-sectional view in the direction along the Y direction illustrating an example of a configuration of the stepped region SRa of the semiconductor memory device 3a according to another embodiment. FIG. 17 corresponds to FIG. 2B of the first embodiment described above.

As illustrated in FIG. 17, in the stepped region SRa included in the semiconductor memory device 3a, stepped portions SPds are arranged on both sides in the Y direction of the stepped portion SP. That is, among the three plate-like contacts LI illustrated in FIG. 17, similarly to the plate-like contacts LI on both sides in the Y direction, the plate-like contact LI at the center, which is arranged in the stacked body LM between the mortar-shaped regions where the insulating layer 51 is formed, is also arranged so as that the stepped portions SPds descending in directions away from the plate-like contact LI are arranged on both sides in the Y direction.

That is, the semiconductor memory device 3a according the other embodiment includes the plate-like contact LI as the first plate-like portion extending in the X direction on one outer side in the Y direction of the stepped portion SP and the plate-like contact LI as the second plate-like portion extending in the X direction on the other outer side in the Y direction of the stepped portion SP.

As a result, in any plate-like contact LI extending in the X direction in the stepped region SRa, it is not necessary to form the slit so as to penetrate the thick insulating layer covering the stepped portion SP in the formation process, and it is possible to suppress the increase in the width of the slit in the Y direction. Thus, in the stepped region SRa included in the semiconductor memory device 3a, instead of the columnar portions HRc made of insulating layers or the like, the columnar portions HRm having the same layer structure as the pillars PL can be arranged. This is because the risk of contact with the plate-like contacts LI is reduced.

In this case, the columnar portions HRm can be consistently arranged at various places of the stacked body LM, and the manufacturing process of the semiconductor memory device 3a can be further simplified by eliminating the structure formed separately from the pillars PL, and the manufacturing cost can be reduced.

FIG. 18 is a cross-sectional view in the direction along the X direction illustrating an example of a configuration of the stepped region SRb of the semiconductor memory device 3b according to another embodiment. FIG. 18 corresponds to FIG. 2A of the first embodiment described above.

As illustrated in FIG. 18, the semiconductor memory device 3b includes the stepped region SRb arranged between memory regions MRm and MRn arranged in the X direction, and includes a stepped portion SPb facing the stepped portion SP in the X direction instead of the stepped portion SPdf. The stepped portion SPb has a shape in which the plurality of word lines WL and the select gate lines SGD and SGS are processed in a stepped shape, and electrically leads out the word lines WL and the select gate lines SGD and SGS to the upper layer wiring MX similarly to the stepped portion SP. In addition, in each of stacked bodies LMm and LMn to which the memory regions MRm and MRn belong, a dummy region (not illustrated) is arranged in each of the regions in the stacked bodies LMm and LMn on the opposite side of the stepped portions SP and SPb.

The stepped portion SP extends in the X direction at a position closer to the memory region MRm and descends in a direction away from the memory region MRm. In addition, the stepped portion SPb extends in the X direction so as to face the stepped portion SP at a position closer to the memory region MRn, and descends in a direction away from the memory region MRn. That is, the stepped portions SP and SPb are arranged so as to descend in a direction approaching each other, and the directions of ascent and descent in the X direction are reversed. Note that, in the stepped region SRb, a plurality of columnar portions (not illustrated) made of insulating layers and the like is dispersedly arranged.

A contact CC penetrating the insulating layers 52 and 51 and the insulating layer OL constituting the terrace surface of each step is connected to each of the word lines WL and the select gate lines SGD and SGS constituting each step of the stepped portion SPb, similarly to the word lines WL and the select gate lines SGD and SGS constituting each step of the stepped portion SP. The contact CC has the same layer structure as the contact CC arranged in the stepped portion SP, and is connected to the upper layer wiring MX (see FIG. 1B) arranged in the further upper layer via the plug V0 arranged in the insulating layer 53.

With the above configuration, the word lines WL and the select gate lines SGD and SGS are divided in the X direction at the boundary portions of the stepped portions SP and SPb, and the stacked body LMm including the stepped portion SP and the stacked body LMn including the stepped portion SPb are provided to be divided so as to correspond to the memory regions MRm and MRn.

In this case, the plate-like contact (not illustrated) includes a portion connecting a pair of portions extending in the direction along the X direction adjacent to each other in the Y direction while bending at an obtuse angle at a position in the dummy region on one side in the X direction of the stacked bodies LMm and LMn in the stacked bodies LMm and LMn.

As a result, the stacked bodies LMm and LMn to which the memory regions MRm and MRn belong, respectively, are isolated from respective portions of parts of the stacked bodies LMm and LMn located on the opposite sides to the memory regions MRm and MRn in the X direction in the dummy region (not illustrated). In addition, the stacked bodies LMm and LMn excluding the respective portions of the stacked bodies LMm and LMn are divided in the Y direction.

In this manner, by arranging the plurality of stacked bodies LMm and LMn divided in the X direction and providing the stepped portions SP and SPb to which the contacts CC are connected, the voltage applied from the contacts CC can be spread throughout the memory regions MRm and MRn on both sides in the X direction of the stepped portions SP and SPb, and the potential difference between the memory regions MRm and MRn can be reduced.

Note that other configurations in the dummy region are similar to those of the dummy region of the first and second embodiments described above. That is, the configuration includes a dummy stepped portion in which the plurality of word lines WL and select gate lines SGD and SGS and the plurality of insulating layers OL are processed into a steep stepped shape and terminated at the end portion on the opposite side to the memory region MR in the X direction. In the dummy stepped portion, a plurality of columnar portions HRm having the same layer structure as the pillars PL is dispersedly arranged.

(Modification Without Stepped Portion)

Figure 19:
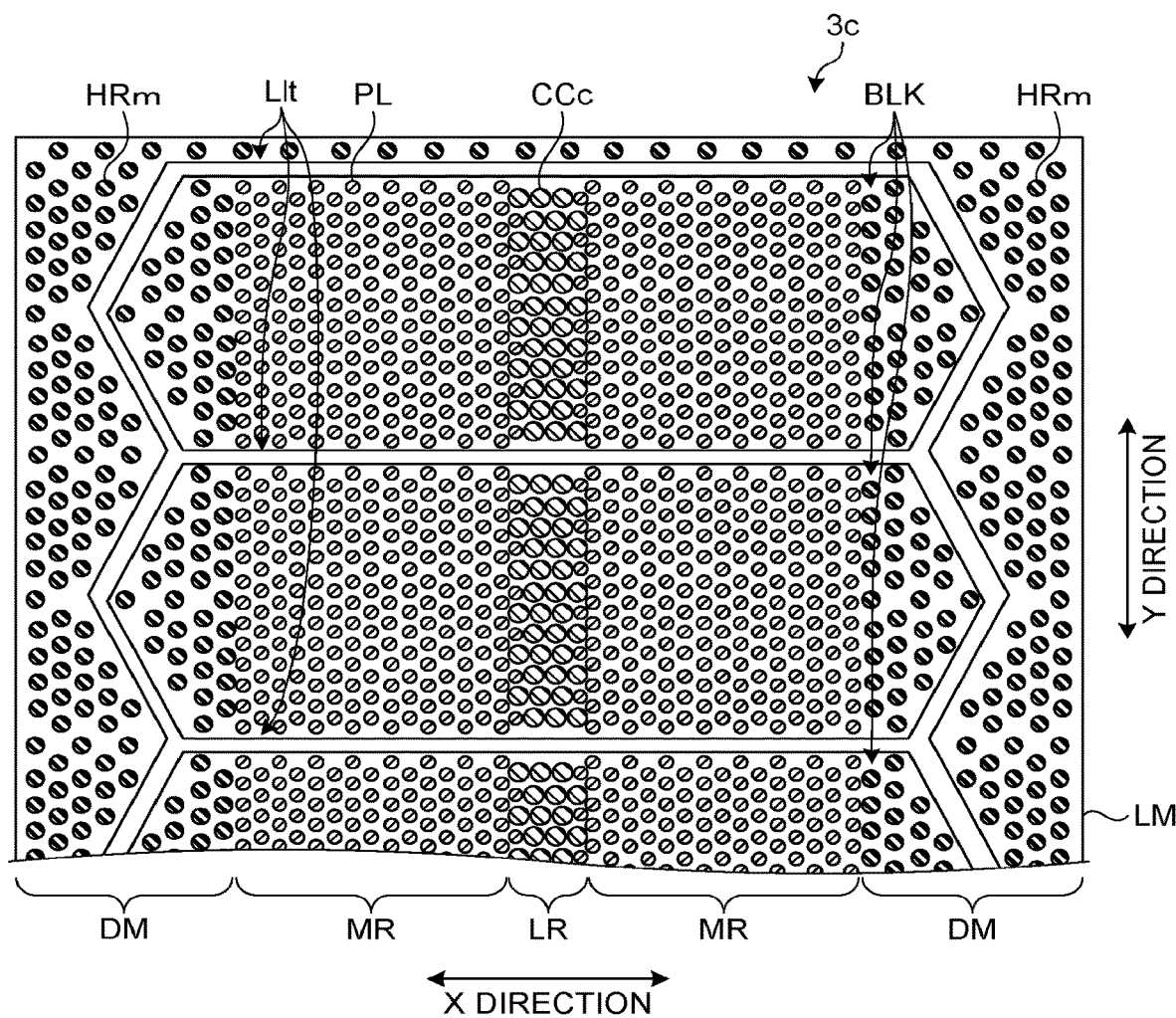
FIG. 19 is a schematic top view illustrating an example of a configuration of a semiconductor memory device according to another embodiment.

The above configuration in which the plate-like contacts LI are connected to each other in the vicinity of the end portions of the stacked body LM in the X direction is also applicable to a semiconductor memory device not including the stepped portion SPdx. FIGS. 19 to 20B illustrate an example of a semiconductor memory device 3c not including the stepped portion SPdx.

FIG. 19 is a schematic top view illustrating an example of a configuration of the semiconductor memory device 3c according to another embodiment.

As illustrated in FIG. 19, as an example of a case without the stepped portion SPdx, instead of the stepped region SR, a lead-out region LR sandwiched between the memory regions MR on both sides in the X direction, for example, is arranged in the stacked body LM of the semiconductor memory device 3c. In the lead-out region LR, a plurality of contacts CCc embedded in the stacked body LM is arranged.

In addition, the stacked body LM of the semiconductor memory device 3c is divided in the Y direction by the plate-like contacts LIt except for the end portions in the X direction. The plate-like contacts LIt extending in the X direction in the memory regions MR and the lead-out region LR are connected to each other at positions in the dummy regions DM by causing the end portion in the X direction of the plate-like contact LIt to extend to be inclined with respect to the X direction so as to approach another plate-like contact LIt adjacent in the Y direction, for example, similarly to the plate-like contact LIs of the second embodiment described above.

Figure 20A:
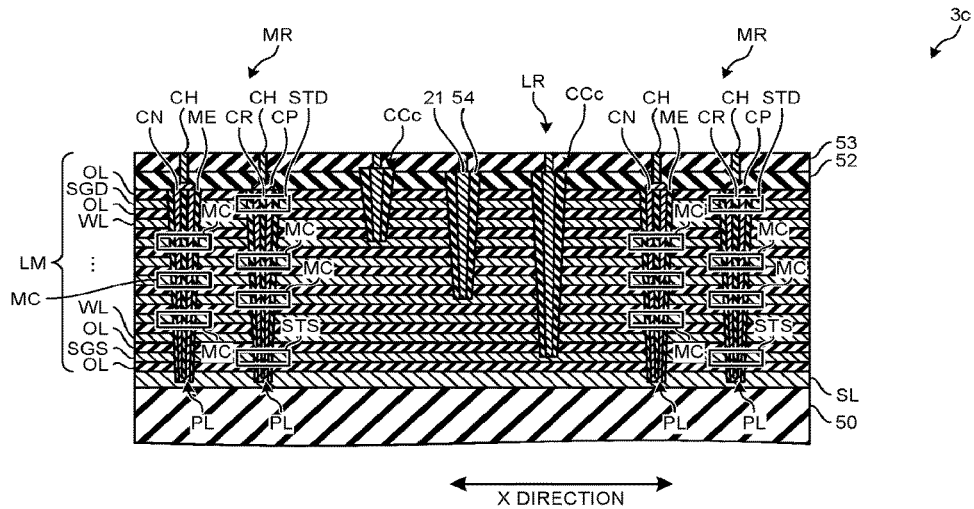
FIGS. 20A and 20B are diagrams illustrating an example of a detailed configuration of the semiconductor memory device according to the other embodiment.
Figure 20B:
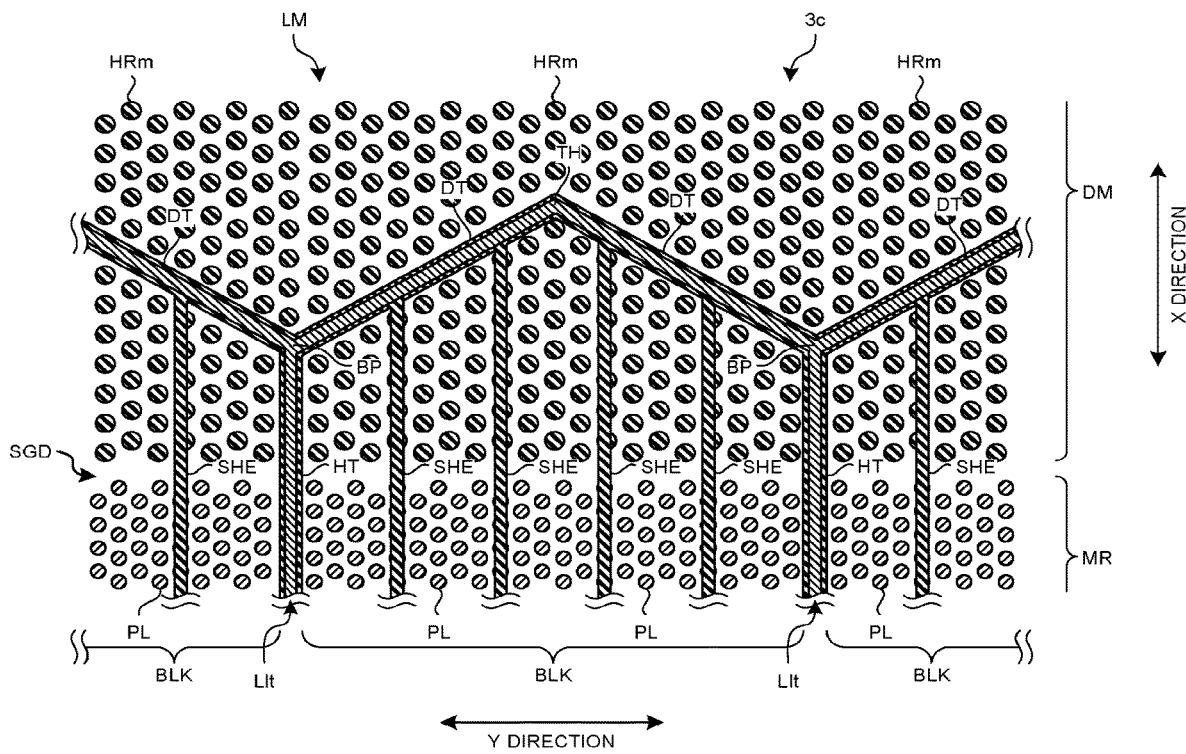

FIGS. 20A and 20B are diagrams illustrating an example of a detailed configuration of the semiconductor memory device 3c according to the other embodiment. FIG. 20A is a cross-sectional view of the semiconductor memory device 3c in the direction along the X direction, and corresponds to FIG. 2A of the first embodiment described above. FIG. 20B is a cross-sectional view of the XY plane including the dummy region DM in the stacked body LM of the semiconductor memory device 3c, and corresponds to FIG. 3 of the first embodiment described above.

As illustrated in FIG. 20A, in the lead-out region LR of the semiconductor memory device 3c, a plurality of contacts CCc extending in the stacked body LM in the stacking direction of the stacked body LM and reaching the depths of the word lines WL or the select gate lines SGD and SGS of different layers is arranged. In the example of FIG. 20A, the contacts CCc connected to the select gate line SGS and the plurality of word lines WL of different layers are illustrated. However, the arrangement order of the contacts CCc for each layer is not limited to the example of FIG. 20A.

As a result, the plurality of contacts CCc is connected to the word lines WL or the select gate lines SGD or SGS of different layers, and can be electrically led out to the upper layer wiring MX.

Note that each contact CCc has the same layer structure as the contact CC in the first embodiment and the like described above. However, the insulating layer 54 on the side wall of the contact CCc may be thicker than the contact CC described above. As a result, even if the contacts CCc are arranged in the stacked body LM, it is possible to suppress occurrence of an electrical short circuit or the like between the contacts CCc and the word lines WL except the corresponding word line WL to be connected the contact CCc or the like.

As described above, when the semiconductor memory device 3c includes, for example, the plurality of contacts CCc extending in the stacked body LM, the dummy stepped portion SPdx is not formed at the end portion in the X direction of the stacked body LM. In addition, no dummy stepped portion is formed at the end portion in the Y direction of the stacked body LM.

As illustrated in FIG. 20B, the stacked body LM includes the dummy region DM in which the plurality of columnar portions HRm is dispersedly arranged and which does not include the stepped portion SPdx at the end portion in the X direction. Each of the plurality of plate-like contacts LIt includes a plurality of portions HT, DT, and DT and a bent portion BP, for example, similarly to the plate-like contacts LIs according to the second embodiment described above. In the two plate-like contacts LIt adjacent in the Y direction, the portions DT included in the two plate-like contacts LIt are connected to each other by extending to be inclined so as to approach each other in the dummy region DM.

With the above configuration, the plate-like contacts LIt as the first and second plate-like portions adjacent to each other in the Y direction are directly connected to each other in the dummy region DM and terminate. That is, the stacked body LM of the memory region MR is isolated from a part of the stacked body LM portion opposite to the memory region MR in the X direction of the dummy region DM by the plurality of plate-like contacts LIt, and the stacked body LM excluding the stacked body LM portion at the end portion in the X direction is divided in the Y direction by the plurality of plate-like contacts LIt. As a result, the plurality of block regions BLK between the plurality of plate-like contacts LIt is electrically isolated from each other.

Figure 21A:
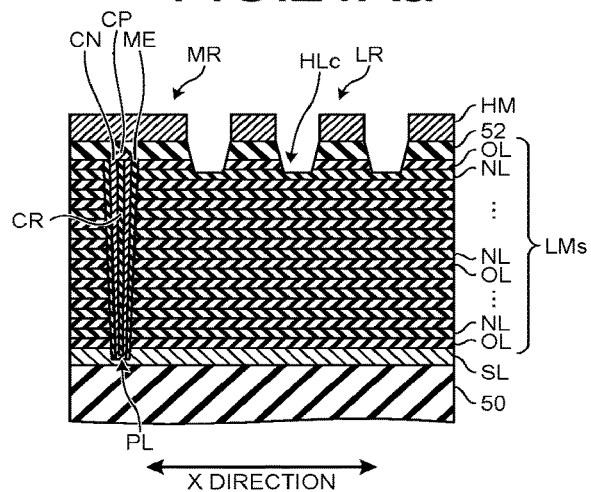
FIGS. 21Aa to 21Bc are diagrams illustrating a part of the exemplary procedure of a method for manufacturing the semiconductor memory device according to the other embodiment.

The contacts CCc of the semiconductor memory device 3c can be formed by, for example, the method illustrated in FIGS. 21Aa to 21Bc. FIGS. 21Aa to 21Bc are diagrams illustrating a part of the exemplary procedure of the method for manufacturing the semiconductor memory device 3c according to the other embodiment.

Note that the semiconductor memory device 3c can be manufactured in a similar manner to the semiconductor memory device 1 according to the first embodiment described above, for example, except for the method of forming the contacts CCc. FIGS. 21Aa to 21Bc illustrate an example of the procedure of the method of forming the contacts CCc among the procedures of the method for manufacturing the semiconductor memory device 3c.

Figure 21B:
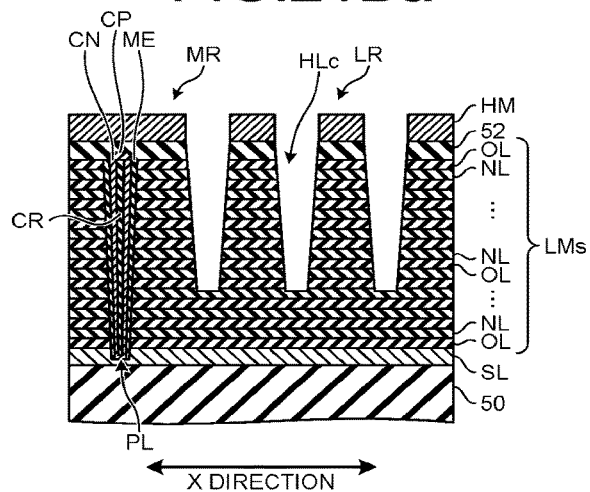
Figure 21A:
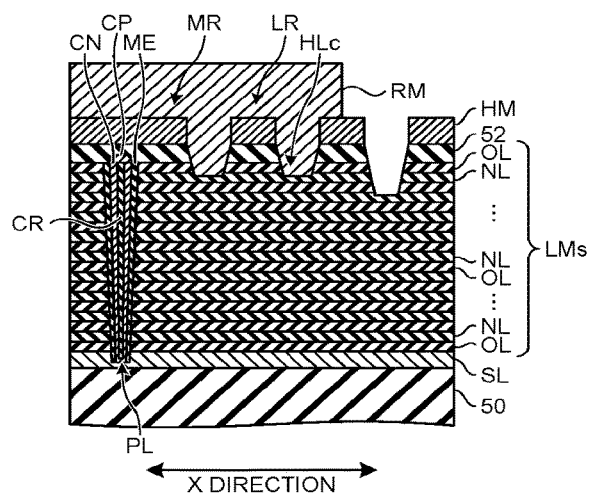
Figure 21B:
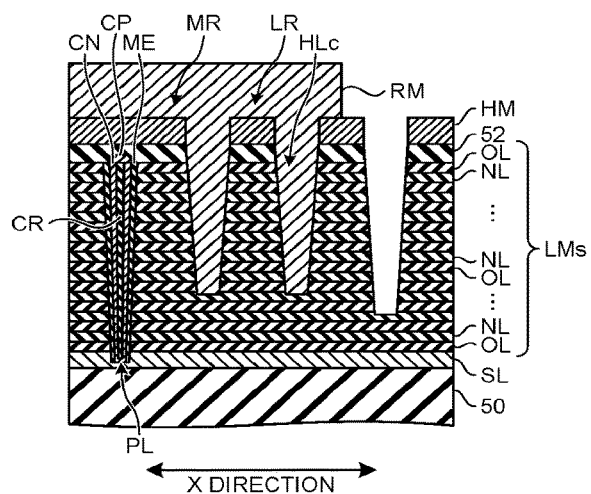
Figure 21A:
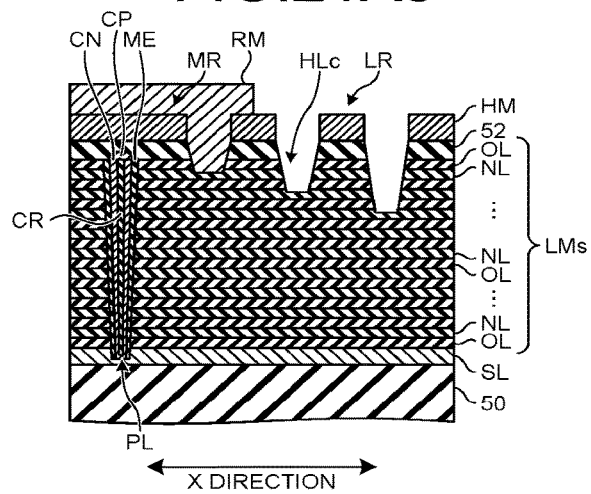
Figure 21B:
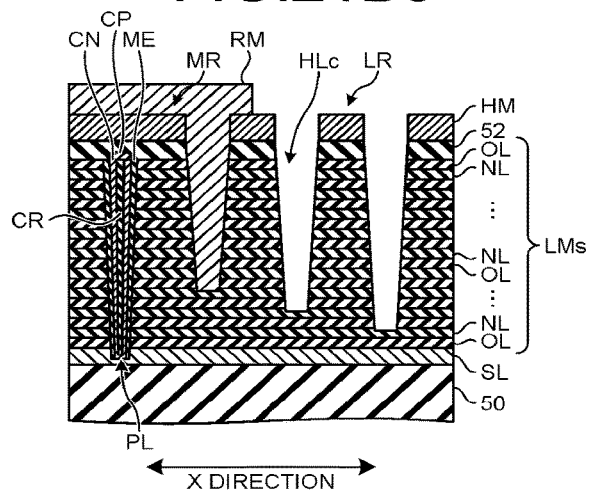

In addition, FIGS. 21Aa to 21Ac are cross-sectional views along the X direction of the lead-out region LR in the manufacturing process. FIGS. 21Ba to 21Bc are cross-sectional views along the X direction at a position different from that in FIGS. 21Aa to 21Ac in the lead-out region LR in the manufacturing process.

As illustrated in FIG. 21Aa, for example, after a plurality of pillars PL is formed, a hard mask pattern HM that covers the upper surface of the insulating layer 52 on the stacked body LMs and has openings at the formation position of the contacts CCc is formed with respect to the stacked body LMs before the replacement processing. The hard mask pattern HM is, for example, a layer of a silicon-based material such as an amorphous silicon layer or a polysilicon layer that is not removed by oxygen plasma or the like. Openings of the hard mask pattern HM are arranged in the X direction, for example.

The insulating layer 52 on the stacked body LMs and the uppermost insulating layer OL of the stacked body LMs exposed from the openings of the hard mask pattern HM are removed by etching. As a result, a plurality of holes HLc reaching the depth of the uppermost insulating layer NL are formed in the stacked body LMs.

As illustrated in FIG. 21Ab, a resist pattern RM covering the upper surface of the hard mask pattern HM and the plurality of holes HLc and having an opening above the hole HLc farthest from the pillar PL in the X direction is formed, for example.

In addition, the insulating layers NL and OL of the stacked body LMs exposed from the openings of the resist pattern RM are etched away one by one, for example. As a result, the bottom of the hole HLc farthest from the pillar PL reaches the depth of the insulating layer NL that is the second layer from the uppermost insulating layer NL.

As illustrated in FIG. 21Ac, the resist pattern RM is slimmed by processing using oxygen plasma or the like. As a result, the end portion of the resist pattern RM on the plurality of holes HLc retracts toward the pillar PL in the X direction, and the second hole HLc from the hole HLc farthest from the pillar PL is exposed.

In addition, the insulating layers NL and OL of the stacked body LMs exposed from the openings of the resist pattern RM are etched away one by one, for example. As a result, the bottom of the hole HLc farthest from the pillar PL reaches the depth of the insulating layer NL that is the third layer from the uppermost insulating layer NL. In addition, the bottom of the second hole HLc from the hole HLc farthest from the pillar PL reaches the depth of the insulating layer NL that is the second layer from the uppermost insulating layer NL.

As described above, the plurality of holes HLc connected to the third insulating layer NL from the uppermost insulating layer NL, the second insulating layer NL from the uppermost insulating layer NL, and the uppermost insulating layer NL is formed.

As illustrated in FIG. 21Ba, in a cross section different from that in FIGS. 21Aa to 21Ac, similar processing is performed in parallel with the processing in FIG. 21Aa described above. However, in the cross section illustrated in FIG. 21Ba, for example, a plurality of holes HLc reaching the depth of the third insulating layer NL from the lowermost insulating layer NL is formed. At this time, for example, the upper surface of the plurality of holes HLc illustrated in FIG. 21Aa is covered with a resist mask or the like, and the holes HLc are maintained at the depth of the uppermost insulating layer NL.

As illustrated in FIG. 21Bb, similar processing is performed in parallel with the processing of FIG. 21Ab described above. As a result, the bottom of the hole HLc farthest from the pillar PL reaches the depth of the insulating layer NL that is the second layer from the lowermost insulating layer NL.

As illustrated in FIG. 21Bc, similar processing is performed in parallel with the processing in FIG. 21Ac described above. As a result, the bottom of the hole HLc farthest from the pillar PL reaches the depth of the lowermost insulating layer NL. In addition, the bottom of the second hole HLc from the hole HLc farthest from the pillar PL reaches the depth of the insulating layer NL that is the second layer from the lowermost insulating layer NL.

As described above, the plurality of holes HLc connected to the lowermost insulating layer NL, the second insulating layer NL from the lowermost insulating layer NL, and the third insulating layer NL from the lowermost insulating layer NL is formed.

Similarly, for example, in a cross section different from any of FIGS. 21Aa to 21Ac and FIGS. 21Ba to 21Bc, a plurality of holes HLc connected to the plurality of insulating layers NL of the intermediate layers to which the plurality of holes HLc of FIGS. 21Ac and 21Bc is not connected, and connected to the plurality of insulating layers NL of different layers is formed.

Note that, by the processing of FIGS. 21Aa to 21Bc, the insulating layers NL and OL may be etched away one by one also in the peripheral regions of both end portions in the X direction and both end portions in the Y direction of the stacked body LMs. Meanwhile, four end portions of the hard mask pattern HM are arranged at each end portion of the stacked body LMs to protect each end portion of the stacked body LMs. Thus, each end portion of the stacked body LMs does not have a stepped shape.

In addition, the processing of FIGS. 21Aa to 21Bc can be performed at a predetermined timing before the start of the replacement processing of the stacked body LMs regardless of the above-described example. That is, the processing of FIGS. 21Aa to 21Bc, the processing of forming the columnar portions HRc of FIGS. 5A and 5B of the first embodiment described above, and the processing of forming the pillars PL of FIGS. 6A to 7C may be performed in any order.

Thereafter, the insulating layer 54 (see FIGS. 20A and 20B) covering the side wall and the bottom of each of the plurality of holes HLc is formed. At this time, the thickness of the insulating layer 54 may be formed to be thicker than the contact CC and the like of the first embodiment described above. In addition, a sacrificial layer such as an amorphous silicon layer is filled inside the insulating layer 54. In addition, the hard mask pattern HM on the stacked body LMs is removed by chemical mechanical polishing (CMP) or the like.

The sacrificial layer covers the inside of the hole HLc until the replacement processing of the stacked body LMs is completed, and is removed after the replacement processing. As a result, the hole HLc is suppressed from being affected by the processing until the replacement processing is completed. In addition, the insulating layer 54 at the bottom of the hole HLc is removed, and the conductive layer 21 (see FIGS. 20A and 20B) is filled in the insulating layer 54 left on the side wall of the hole HLc.

As described above, the contacts CCc of the semiconductor memory device 3c are formed.

According to the semiconductor memory device 3c of the other embodiment, the two plate-like contacts LIt adjacent in the Y direction are connected to each other and terminated by extending to be inclined with respect to the X direction so as to approach each other in the dummy region DM.

As described above, in order to electrically isolate the plurality of block regions, for example, by causing the plate-like contacts to extend into the insulating layer covering the peripheral region of the stacked body or by arranging the plate-like contacts and the plate-like portion orthogonal to each other, there is a risk of increasing the slit width. However, in the semiconductor memory device 3c, it is possible to avoid such a risk, to suppress the increase of the slit width, and to reduce the risk of contact between the columnar portions HRm and the plate-like contacts LIt.

Note that the configurations illustrated in the second and third modifications of the second embodiment described above can also be applied to the semiconductor memory device not including the stepped portion SPdx at both end portions in the X direction of the stacked body LM, like the semiconductor memory device 3c. That is, the semiconductor memory device 3c may include the plate-like portion VT extending in the dummy region DM in the stacking direction of the stacked body LM and the direction along the Y direction and indirectly connecting the plate-like contacts LIt adjacent in the Y direction in the dummy region DM.

(Other Modifications)

In the first and second embodiments and the modifications described above, the insulating layers NL and OL are alternately stacked to form the stacked body LMs. However, the stacked body LMs may be formed in a plurality of tiers, and in that case, the stepped portion SP, the pillar PL, and the columnar portions HRc and HRm may be formed in stages every time the stacked body LMs for one tier is formed. As a result, the number of stacked word lines WL can be further increased.

In addition, in the first and second embodiments and the modifications described above, the peripheral circuit CUA is arranged below the stacked body LM. However, for example, a stacked body may be arranged on a substrate on which a peripheral circuit is arranged, and the peripheral circuit and the stacked body may belong to the same layer. In this case, the peripheral circuit can be arranged in a peripheral region of the stacked body.

Alternatively, the peripheral circuit may be arranged above the stacked body. In this case, a stacked body including various configurations is formed on a substrate differently from the peripheral circuit, and the substrate on which the peripheral circuit is formed and the substrate on which the stacked body is formed are bonded to each other, whereby a semiconductor memory device having such an arrangement is obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a stacked body having a stacked structure in which a plurality of conductive layers and a plurality of insulating layers are alternately stacked one by one, the stacked body including a memory region and a dummy region arranged in a first direction intersecting a stacking direction of the plurality of conductive layers, the dummy region including a first stepped portion in which at least a part of the plurality of conductive layers on an upper layer side is processed in a stepped shape and terminates at an end portion opposite to the memory region in the first direction;
   a plurality of first pillars extending in the stacked body in the stacking direction in the memory region and each forming memory cells at respective intersections with at least a part of the plurality of conductive layers; and
   first and second plate-like portions extending in the stacking direction and the first direction in the stacked body at positions in the memory region away from each other in a second direction intersecting the stacking direction and the first direction, the first and second plate-like portions being directly or indirectly connected to each other and terminating in the dummy region, each of the first and second plate-like portions dividing the stacked body excluding at least a part of the end portion of the dummy region in the second direction, wherein
   the memory region includes:
   a first memory region; and
   a second memory region arranged at a position away from the first memory region in the first direction,
   the stacked body includes a second stepped portion in which the plurality of conductive layers is processed in a stepped shape and that extends in the first direction at a position between the first and second memory regions, and
   the first plate-like portion extends in the first direction outside the second stepped portion in the second direction.

2. The semiconductor memory device according to claim 1, further comprising
   a third plate-like portion extending in the stacking direction and the second direction in the dummy region and indirectly connecting the first and second plate-like portions.

3. The semiconductor memory device according to claim 1, wherein
   the first and second plate-like portions are directly connected to each other by extending to be inclined with respect to the first direction to approach each other at a position in the dummy region.

4. The semiconductor memory device according to claim 1, wherein
   the first plate-like portion includes:
   a first portion extending in the first direction at a position in the memory region; and
   a second portion connected to the first portion and extending to be inclined toward the second plate-like portion with respect to the first direction at a position in the dummy region,
   the second plate-like portion includes:
   a third portion extending in the first direction at a position in the memory region; and
   a fourth portion connected to the third portion and extending to be inclined toward the first plate-like portion with respect to the first direction at a position in the dummy region, and
   an angle formed by the first portion and the second portion and an angle formed by the third portion and the fourth portion are obtuse angles.

5. The semiconductor memory device according to claim 4, wherein
   the second and fourth portions are connected to each other at end portions opposite to end portions connected to the first and third portions respectively.

6. The semiconductor memory device according to claim 4, further comprising
   a third plate-like portion extending in the stacking direction and the second direction in the stacked body in the dummy region and connecting the second and fourth portions, wherein
   an angle formed by the third plate-like portion and the second portion and an angle formed by the third plate-like portion and the fourth portion are obtuse angles.

7. The semiconductor memory device according to claim 4, further comprising a plurality of second pillars dispersedly arranged in the dummy region and extending in the stacked body in the stacking direction, wherein
the second portion extends along an arrangement direction of second pillars adjacent to the second portion among the plurality of second pillars.

8. The semiconductor memory device according to claim 1, further comprising
a plurality of second pillars dispersedly arranged in the dummy region and extending in the stacked body in the stacking direction, wherein
each of the plurality of first pillars includes:
a semiconductor layer extending in the stacked body in the stacking direction; and
a memory layer surrounding an outer periphery of the semiconductor layer, and
each of the plurality of second pillars has a layer structure same as each of the plurality of first pillars.

9. The semiconductor memory device according to claim 1, wherein
the first and second plate-like portions are connected to each other at a position closer to the memory region than the first stepped portion in the first direction.

10. The semiconductor memory device according to claim 1, further comprising
an isolation layer extending in the first direction in the memory region and terminating in the dummy region, the isolation layer penetrating at least an uppermost conductive layer among the plurality of conductive layers or penetrating the uppermost conductive layer and one or more conductive layers continuous in the stacking direction with the uppermost conductive layer among the plurality of conductive layers to selectively isolate one or more conductive layers corresponding to a part of the plurality of conductive layers in the second direction, wherein
the first and second plate-like portions are connected to each other at a terminal portion, in the first direction, of a lowermost conductive layer among the part of the conductive layers penetrated by the isolation layer or at a position in the end portion, in the first direction, corresponding to a portion closer to the memory region than the terminal portion.

11. The semiconductor memory device according to claim 1, wherein
the second plate-like portion extends in the first direction at a position overlapping the second stepped portion.

12. The semiconductor memory device according to claim 1, wherein
the first plate-like portion extends in the first direction outside the second stepped portion on one side in the second direction, and
the second plate-like portion extends in the first direction outside the second stepped portion on the other side in the second direction.

13. A semiconductor memory device comprising:
a stacked body having a stacked structure in which a plurality of conductive layers and a plurality of insulating layers are alternately stacked one by one, the stacked body including a memory region and a dummy region arranged in a first direction intersecting a stacking direction of the plurality of conductive layers, the dummy region including a stepped portion in which at least a part of the plurality of conductive layers on an upper layer side is processed in a stepped shape and terminates at an end portion opposite to the memory region in the first direction;
a plurality of first pillars extending in the stacked body in the stacking direction in the memory region and each forming memory cells at respective intersections with at least a part of the plurality of conductive layers; and
a plate-like portion including a pair of portions extending in the stacking direction and the first direction in the stacked body at least at positions in the memory region away from each other in a second direction intersecting the stacking direction and the first direction, and a connection portion extending to connect the pair of portions while being bent at an obtuse angle at a position in the dummy region of the stacked body, the plate-like portion isolating the stacked body in the memory region from a part, in the first direction, of a stacked body portion in the dummy region opposite to the memory region, the plate-like portion dividing the stacked body excluding the stacked body portion in the dummy region in the second direction.

14. The semiconductor memory device according to claim 13, wherein
the connection portion includes:
a first connection portion connected to one of the pair of portions and extending to be inclined toward the other of the pair of portions with respect to the first direction at a position in the dummy region; and
a second connection portion connected to the other of the pair of portions and extending to be inclined toward the one of the pair of portions with respect to the first direction at a position in the dummy region, wherein
an angle formed by the one of the pair of portions and the first connection portion and an angle formed by the other of the pair of portions and the second connection portion are obtuse angles.

15. The semiconductor memory device according to claim 14, wherein
the first and second connection portions are connected to each other at end portions opposite to end portions connected to the pair of portions, respectively.

16. The semiconductor memory device according to claim 14, wherein
the connection portion further includes a third connection portion extending in the stacking direction and the second direction in the stacked body in the dummy region, the third connection portion connecting the first and second connection portions, and
an angle formed by the first connection portion and the third connection portion and an angle formed by the second connection portion and the third connection portion are obtuse angles.

17. A semiconductor memory device comprising:
a stacked body having a stacked structure in which a plurality of conductive layers and a plurality of insulating layers are alternately stacked one by one, the stacked body including a memory region and a dummy region arranged in a first direction intersecting a stacking direction of the plurality of conductive layers;
a plurality of first pillars extending in the stacked body in the stacking direction in the memory region and each forming memory cells at respective intersections with at least a part of the plurality of conductive layers; and
first and second plate-like portions extending, at positions in the memory region away from each other in a second direction intersecting the stacking direction and the first direction, in the stacked body in the stacking direction and the first direction and terminating in the dummy region, the first and second plate-like portions dividing the stacked body in the second direction excluding at least a part, in the first direction, of the stacked body, wherein the first and second plate-like portions extend to be inclined with respect to the first direction to approach each other at positions in the dummy region, the first and second plate-like portions being directly or indirectly connected to each other and terminating in the dummy region.

18. The semiconductor memory device according to claim 17, further comprising a third plate-like portion extending in the stacked body in the stacking direction and the second direction in the dummy region, the third plate-like portion connecting portions of the first and second plate-like portions inclined with respect to the first direction.

19. The semiconductor memory device according to claim 17, further comprising a plurality of second pillars dispersedly arranged in the dummy region and extending in the stacked body in the stacking direction, wherein portions of the first and second plate-like portions inclined with respect to the first direction extend respectively along arrangement directions of second pillars adjacent to the portions inclined among the plurality of second pillars.

20. The semiconductor memory device according to claim 17, further comprising a plurality of second pillars dispersedly arranged in the dummy region and extending in the stacked body in the stacking direction, wherein each of the plurality of first pillars includes:

a semiconductor layer extending in the stacked body in the stacking direction; and a memory layer surrounding an outer periphery of the semiconductor layer, and each of the plurality of second pillars has a layer structure same as each of the plurality of first pillars.

* * * * *